US009738990B2

(12) United States Patent
Fratello

(10) Patent No.: US 9,738,990 B2
(45) Date of Patent: Aug. 22, 2017

(54) METHOD OF LIQUID-PHASE EPITAXIAL GROWTH OF LEAD ZIRCONATE TITANATE SINGLE CRYSTALS

(71) Applicant: Quest Integrated, Inc., Kent, WA (US)

(72) Inventor: Vincent Fratello, Bellevue, WA (US)

(73) Assignee: Quest Integrated, LLC, Kent, WA (US)

( * ) Notice: Subject to any disclaimer, the term of this patent is extended or adjusted under 35 U.S.C. 154(b) by 174 days.

(21) Appl. No.: 14/420,896

(22) PCT Filed: Dec. 2, 2013

(86) PCT No.: PCT/US2013/072673
§ 371 (c)(1),
(2) Date: Feb. 10, 2015

(87) PCT Pub. No.: WO2014/130119
PCT Pub. Date: Aug. 28, 2014

(65) Prior Publication Data
US 2015/0233015 A1    Aug. 20, 2015

Related U.S. Application Data

(60) Provisional application No. 61/774,139, filed on Mar. 7, 2013, provisional application No. 61/732,062, filed on Nov. 30, 2012.

(51) Int. Cl.
*C30B 19/12* (2006.01)
*C30B 19/02* (2006.01)
(Continued)

(52) U.S. Cl.
CPC .............. *C30B 19/12* (2013.01); *C30B 19/02* (2013.01); *C30B 19/04* (2013.01); *C30B 29/32* (2013.01); *H01L 41/18* (2013.01)

(58) Field of Classification Search
CPC ......... C30B 19/00; C30B 19/02; C30B 19/04; C30B 19/06; C30B 19/062; C30B 19/08;
(Continued)

(56) References Cited

U.S. PATENT DOCUMENTS 5,413,067 A    5/1995 Zarka
5,460,046 A *  10/1995 Maltby ................. G01N 29/09
                                                    73/623
(Continued)

FOREIGN PATENT DOCUMENTS

CN    1274954 A    11/2000
CN    1414149 A    4/2003
(Continued)

OTHER PUBLICATIONS

International Preliminary Report on Patentability mailed Jun. 2, 2015, issued in corresponding International Application No. PCT/US2013/072673, filed Dec. 2, 2013, 6 pages.
(Continued)

*Primary Examiner* — Kenneth A Bratland, Jr.
(74) *Attorney, Agent, or Firm* — Christensen O'Connor Johnson Kindness PLLC

(57) ABSTRACT

Growth of single crystals of lead zirconate titanate (PZT) and other perovskites is accomplished by liquid phase epitaxy onto a substrate of suitable structural and lattice parameter match. A solvent and specific growth conditions for stable growth are required to achieve the desired proportions of Zr and Ti.

17 Claims, 14 Drawing Sheets

(51) Int. Cl.
*C30B 19/04* (2006.01)
*C30B 29/32* (2006.01)
*H01L 41/18* (2006.01)

(58) Field of Classification Search
CPC ......... C30B 19/10; C30B 19/12; C30B 29/00;
C30B 29/10; C30B 29/22; C30B 29/32;
H01L 41/16; H01L 41/18; H01L 41/187;
H01L 41/1875; H01L 41/1876
USPC ........... 117/2, 11, 53–54, 58, 60, 63–67, 73,
117/78–80, 902, 937, 944
See application file for complete search history.

(56) References Cited

U.S. PATENT DOCUMENTS

| | | | |
|---|---|---|---|
| 7,427,818 | B2 | 9/2008 | Yasuda |
| 8,124,251 | B2 | 2/2012 | Yao |
| 2002/0179000 | A1 | 12/2002 | Lee |
| 2003/0106489 | A1 | 6/2003 | Lung |
| 2003/0223155 | A1* | 12/2003 | Uchiyama ............. H01L 41/332 360/294.4 |
| 2006/0091434 | A1* | 5/2006 | Eom ................. H01L 21/31691 257/295 |
| 2010/0001619 | A1 | 1/2010 | Yuuya |

FOREIGN PATENT DOCUMENTS

| | | | |
|---|---|---|---|
| JP | H5-319971 | A | 12/1993 |
| JP | 09-318827 | * | 12/1997 |
| JP | 2003-272324 | A | 9/2003 |
| JP | 3963404 | B2 | 8/2007 |
| JP | 2009-054934 | * | 12/2009 |

OTHER PUBLICATIONS

International Search Report and Written Opinion mailed Sep. 26, 2014, issued in corresponding International Application No. PCT/US2013/072673, filed Dec. 2, 2013, 10 pages.
Extended European Search Report mailed Dec. 1, 2015, issued in corresponding International Application No. PCT/US2013/072673, filed Dec. 2, 2013, 7 pages.
Rane, M.V., et al., "Enthalpies of Formation of Lead Zirconate Titanate (PZT) Solid Solutions," Journal of Solid State Chemistry 161(2):402-409, Nov. 2001.
Notification of the First Office Action, mailed Oct. 31, 2016, issued in corresponding Chinese Application No. 201380067374.9, filed Dec. 2, 2013, 13 pages.
Rodriguez Contreras, J., et al., "Surface Treatment Effects on the Thickness Dependence of the Remanent Polarization of $PbZr_{0.52}Ti_{0.48}O_3$ Capacitors," Applied Physics Letters 83(1):126-128, Jul. 2003.
Notification of Reasons for Refusal dated May 31, 2017, issued in corresponding Japanese Patent Application No. 2015-545503, filed Dec. 2, 2013, 7 pages.
Rodríguez Contreras, J., et al., "Structural and Ferroelectric Properties of Epitaxial $PbZr_{0.52}Ti_{0.48}O_3$ and $BaTiO_3$ Thin Films Prepared on $SrRuO_3/SrTiO_3(100)$ Substrates," MRS [Materials Research Society] Symposium Proceedings Online Library Archives 688:C8.10.1—C8.10.6, Jan. 2001.

* cited by examiner

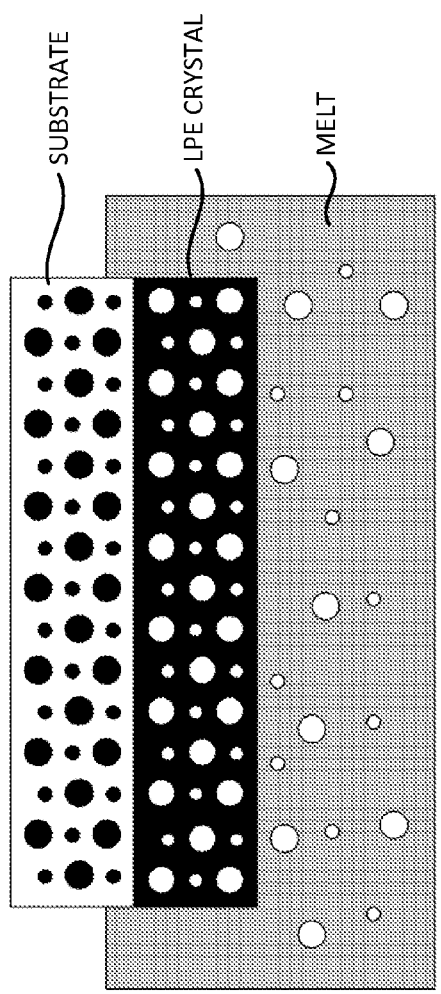
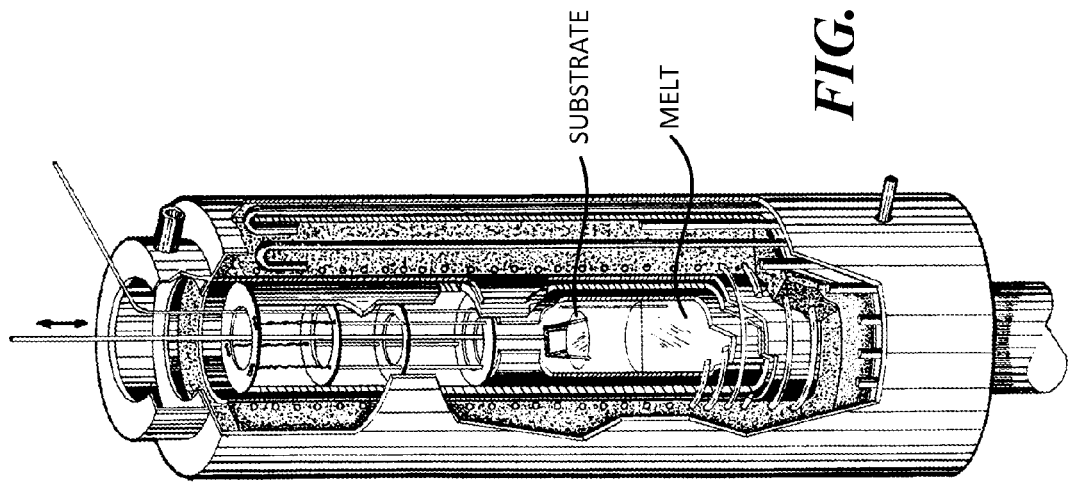
FIG. 6
FIG. 7

METHOD OF LIQUID-PHASE EPITAXIAL GROWTH OF LEAD ZIRCONATE TITANATE SINGLE CRYSTALS

CROSS-REFERENCES TO RELATED APPLICATIONS

This application claims the benefit of U.S. Patent Application Nos. 61/732,062, filed Nov. 30, 2012, and 61/774,139, filed Mar. 7, 2013. The disclosure of each is incorporated herein by reference in its entirety.

BACKGROUND

Perovskites

Perovskites are a class of compounds that have a similar crystal structure to the mineral perovskite (calcium titanate—$CaTiO_3$). Like garnets and some other minerals, perovskites are network compounds—that is to say they are defined by a network of anions (negative ions, most commonly oxygen $O^{2-}$) with specific holes for cations (positive ions, most commonly metallic elements). Half the metals in the periodic table can be inserted into the cation sites and still have a perovskite structure as long as constraints of valence and ionic size are met. The most common perovskite formula is $ABO_3$, though other anions are possible and off-stoichiometry compounds with vacancies occur. The A site is a large 12-coordinated cubo-octahedral hole typically occupied by a cation with an ionic radius greater than or equal to that of $O^{2-}$ as this site is equivalent in size and coordination to an oxygen vacancy. The B site is a smaller 6-coordinated octahedral hole.

Ordered and disordered compounds with two cations on the A (($A_zA'_{(1-z)})BO_3$) or, more commonly, B ($A(B_xB'_{(1-x)})O_3$) sites are possible with formula units and unit cells represented by multiples of the simple perovskite. Ordered and disordered $A_2BB'O_6$ (often written as $A(B_{1/2}B'_{1/2})O_3$) tends toward cubic/tetragonal/orthorhombic/monoclinic unit cells, while ordered $A_3BB'_2O_9$ (often written as $A(B_{1/3}B'_{2/3})O_3$) tends toward hexagonal/rhombohedral unit cells.

The $ABO_3$ stoichiometry constrains the sum of the average cation valences on the A and B sites of a stoichiometric oxide perovskite to be 6+, but that can be accomplished with various combinations. If the A site is populated completely by a divalent ion such as $Pb^{2+}$, the average B site valence must be 4+. In particular $A^{+2}B_xB'_{1-x}O_3$ compounds occur in ordered and disordered states with stoichiometries that depend on the various B valences that must have a weighted average of 4+, e.g., $A^{2+}B^{3+}_{1/2}B'^{5+}_{1/2}O_3$ (½×3+½×5=4) and $A^{2+}B^{2+}_{1/3}B'^{5+}_{2/3}O_3$ (⅓×2+⅔×5=4).

Because of the common structure, solid solutions readily form between two perovskites, where two end members, e.g., $ABO_3$ and $A'B'O_3$ may mix with fractions 0<x<1 to a range of disordered materials $A_xA'_{1-x}B_xB'_{1-x}O_3$. If A=A' this is somewhat simplified to $AB_xB'_{1-x}O_3$ as is the case for the materials discussed in this application. However, because solid solutions are not line compounds with a fixed composition, these have complex melting and crystallization behaviors as is well known to those familiar with the art. For even a simple binary solid solution phase diagram, the compound that crystallizes at any composition will tend to be biased toward the higher melting compound.

Perovskites comprise a number of technologically important materials because of their range of interesting properties. These materials can be ferroelectric, ferromagnetic, multiferroic, piezoelectric, pyroelectric, magnetic, magnetoresistive, electrooptic, magnetooptic, etc.

Piezoelectric Lead Zirconate Titanate

Lead zirconate titanate (PZT-$Pb(Zr_xTi_{1-x})O_3$) is a perovskite that is a solid solution between lead titanate (PT-$PbTiO_3$) and lead zirconate (PZ-$PbZrO_3$). It is piezoelectric, which is to say there is a linear electromechanical interaction between the mechanical and the electrical states of the material. The composition of most technological interest is nearly equimolar, $Pb(Zr_{0.52}Ti_{0.48})O_3$ at the morphotropic phase boundary (MPB) where the proximity of the rhombohedral-tetrahedral (R-T) phase transformation results in an increase in the dielectric permittivity and the piezoelectric coefficients. Additives are commonly used to tailor the piezoelectric, dielectric and particulate properties of piezoelectric PZT ceramics.

PZT is the most commonly used of the piezoelectric perovskites because of its excellent combination of piezoelectric and dielectric properties, high Curie temperature, high R-T transition temperature and ability to make both hard (high coercivity) and soft (low coercivity) materials. It is commercially available in ceramic form, though there are also experimental thin films formed by vapor phase methods. This is because, unlike some other piezoelectric perovskites, it has not successfully been grown as single crystals of any significant size. Both the PZ end member and all the PZT solid solutions are non-congruent, which is to say that this crystal composition cannot be grown from a melt of the same composition. Even the Bridgman method used successfully to grow non-congruent relaxor ferroelectric-PT solid solutions, as will be discussed below, cannot practically overcome the thermodynamic issues with this material. Therefore an invention is required to permit growth of single crystals of significant size.

The $Pb(Zr_xTi_{1-x})O_3$ room temperature lattice parameters near the MPB (x=0.52 atoms per formula unit (a/fu)) are given in Table I. The average of the a and b lattice parameters in the (001) plane is ~4.055 Å at the MPB showing there is little dependence on the Zr concentration x. At high temperatures at which crystals might be grown, this compound becomes cubic in structure.

TABLE I $Pb(Zr_xTi_{1-x})O_3$ lattice parameters in Å.

| x (a/fu) | a (Å) | b (Å) | c (Å) |
|---|---|---|---|
| 0.49 | 4.03 | | 4.16 |
| 0.53 | 4.03 | 4.08 | 4.15 |
| 0.56 | 4.03 | 4.06 | 4.14 |
| 0.59 | 4.03 | 4.06 | 4.14 |

Relaxor Ferroelectric-Normal Ferroelectric Solid Solutions

Relaxor ferroelectric-normal ferroelectric materials are disordered perovskite solid solutions on the B site between high dielectric constant relaxor ferroelectric materials and high Curie temperature normal ferroelectrics such as lead titanate (PT). These have achieved technological importance in single crystal form in piezoelectric transducers, actuators and sensors through increases in piezoelectric coefficients, $d_{33}$, electromechanical coupling, $k_{33}$, dielectric constants $\in_{33}^T/\in_0$ and saturation strains >1% while having lower losses and a lower modulus.

Relaxor perovskite materials have the formula $Pb(B_xB'_{(1-x)})O_3$ where B is a low valence cation and B' is a high valence cation. Two typical formula units are (1) $Pb(B^{2+}_{1/3}B'^{5+}_{2/3})O_3$, exemplified by $Pb(Mg_{1/3}Nb_{2/3})O_3$ (PMN) and $Pb(Zn_{1/3}Nb_{2/3})O_3$ (PZN) and (2) $Pb(B^{3+}_{1/2}$ $B'^{5+}_{1/2})O_3$ exemplified by $Pb(In^{3+}_{1/2}Nb^{5+}_{1/2})O_3$ (PIN) and $Pb(Yb^{3+}_{1/2}Nb^{5+}_{1/2})O_3$ (PYN). First generation single crystals of binary PMN-PT solid solutions have been grown by the Bridgman method and offer high performance with ultra-high electromechanical coupling factors $k_{33}$>0.9 and piezoelectric coefficients $d_{33}$>1500 pC/N.

However, these materials are limited in temperature and acoustic power by $T_{R-T}$, the rhombohedral to tetragonal phase transition temperature, which occurs at significantly lower temperatures than the Curie temperature $T_C$. For many applications thermal stability is a requirement in terms of dielectric and piezoelectric property variations and thermal depolarization can result from post-fabrication processes.

In addition to the thermal environment, ferroelectric crystals used in electromechanical devices, such as high power ultrasonic transducers or actuators, are subjected to high electric fields, which necessitate that the crystals possess low dielectric/mechanical losses and relatively high coercive fields. The mechanical quality factors (Q) (inverse of the mechanical losses of the crystals) of PMN-PT and PZN-PT crystals are found to be less than 100, similar to "soft" PZT ceramics. The low mechanical Q limits single crystal PMN-PT to low frequency actuators or resonant power transducers that operate at low duty cycles. Furthermore, the coercive field ($E_C$) of crystals, being only 2-3 kV/cm, restricts their use to low AC voltage applications or devices requiring a "biased" drive level.

Second generation ternary solid solutions among PIN, PMN and PT (PIMNT) and PYN, PMN and PT (PYMNT) have improved properties, but still much lower Curie and R-T transition temperatures than PZT as well as much lower mechanical Q's and coercivities. Thus, single crystal systems with high Curie and R-T transition temperatures are desired for enhanced temperature usage range, thermal stability and acoustic power.

The crystallization paths of these materials are as complex as the phase diagrams. Relaxor-PT ferroelectric single crystals are, by definition, solid solutions. For a simple binary solid solution phase diagram, the crystal composition that crystallizes first from any given melt composition will tend to be biased toward the higher melting compound. The farther apart the two melting points, the more the liquidus (temperature where the last solid phase melts on heating or the first solid phase appears on cooling) deviates from the solidus (temperature where the last liquid phase solidifies on cooling or the first liquid phase appears on heating) and therefore more segregation occurs. PMN-PT and PIMNT have been successfully grown up to 3" in diameter by the Bridgman method. However the non-unity segregation coefficient $K_{PT}\approx 0.85$ results in a gradient in the composition resulting from selective depletion of the more refractory PMN phase. Attempts have been made to alleviate this with zone leveling, but there is still a significant technological issue of non-uniformity of product.

Therefore commercial crystal growth of PMN-PT is initiated from a melt of composition that will produce the desired MPB monoclinic or multi-phase region in the main body of the crystal, but in fact the two ends are of different crystal structures with the PMN-rich bottom (first crystallized) being stable rhombohedral at room temperature, the middle being MPB with monoclinic structure coexisting with rhombohedral or tetragonal and the PT-rich top (last crystallized) being stable tetragonal at room temperature. A nominal 31% PT starting charge will vary in PT concentration from 26% at the seed to 40% at the end. Only the central MPB region with PT concentration 31-37% is used in device applications and the rhombohedral bottoms (26-30% PT) and tetragonal (38-40% PT) tops are cut off as scrap.

TABLE II

Room temperature structures and lattice parameters of PMN relaxor ferroelectrics and their solid solutions with PT normal ferroelectrics. In the MPB region multiple phases are present in the proportions shown with R = rhombohedral, M = Monoclinic, O = Orthorhombic and T = Tetragonal. The early data on rhombohedral phases does often does not record (nr) the rhombohedral angle, but only the pseudo-cubic lattice constant a.

| Composition | PT (%) | Structure | Rhombohedral a (Å) | α (°) | Monoclinic a (Å) | b (Å) | c (Å) | β (°) | Tetragonal a (Å) | c (Å) | Ref. |
|---|---|---|---|---|---|---|---|---|---|---|---|
| PMN | 0 | R | 4.0464 | nr | | | | | | | [1] |
| PMN-PT | 10 | R | 4.0386 | nr | | | | | | | [1] |
| PMN-PT | 20 | R | 4.0302 | nr | | | | | | | [2] |
| PMN-PT | 25 | R | 4.024 | 89.915 | | | | | | | [3] |
| PMN-PT | 30 | R | 4.017 | 89.89 | | | | | | | [4] |
| PMN-PT | 31 | R30% M70% | 4.017 | 89.89 | 4.018 | 4.007 | 4.026 | 90.15 | | | [4] |
| PMN-PT | 33 | M75% T25% | | | 4.019 | 4.006 | 4.032 | 90.19 | 4.005 | 4.046 | [4] |
| PMN-PT | 35 | T65% M/O35% | | | 4.018 | 4.000 | 4.035 | 90.12 | 4.000 | 4.044 | [4] |
| PMN-PT | 37 | T80% | | | | | | | 3.998 | 4.049 | [4] |
| PMN-PT | 39 | T | | | | | | | 3.994 | 4.047 | [4] |
| PMN-PT | 39.5 | T | | | | | | | 3.989 | 4.054 | [5] |
| PMN-PT | 42 | T | | | | | | | 3.984 | 4.054 | [5] |
| PMN-PT | 44 | T | | | | | | | 3.976 | 4.048 | [5] |
| PMN-PT | 47 | T | | | | | | | 3.978 | 4.056 | [5] |
| PT | 100 | T | | | | | | | 3.9006 | 4.155 | [6] |

[1] B. Dkhil, J. M. Kiat, G. Calvarin, G. Baldinozzi, S. B. Vakhrushev and E. Suard "Local and long range polar order in the relaxor-ferroelectric compounds $PbMg_{1/3}Nb_{2/3}O_3$ and $PbMg_{0.3}Nb_{0.6}Ti_{0.1}O_3$" Phys. Rev. B 65 (2001) 024104.
[2] H. W. King, S. H. Ferguson, D. F. Waechter and S. E. Prasad, "An X-ray Diffraction Study of PMN-PT Ceramics Near the Morphotropic Phase Boundary," Proc. ICONS 2002 Inter. Conf. Sonar.
[3] O. Noblanc, P Gaucher and G. Calvarin "Structural and dielectric studies of $Pb(Mg_{1/3}Nb_{2/3})O_3$— $PbTiO_3$ ferroelectric solid solutions around the morphotropic boundary," J. Appl. Phys. 79 (1996) 4291.
[4] B. Noheda, D. E. Cox, G. Shirane, J. Gao and Z.-G. Ye, "Phase Diagram of the Ferroelectric Relaxor $(1-x)PbMg_{1/3}Nb_{2/3}O_3$—$xPbTiO_3$" Physical Review B 66 (2002) 054104.
[5] J. C. Ho, K. S. Liu and I. N. Lin, "Study of Ferroelectricity in the PMN-PT System Near the Morphotropic Phase Boundary," J. Mat. Sci 28 (1993) 4497.
[6] S. A. Mabud and A. M. Glazer, Lattice Parameters and Birefringence in $PbTiO_3$ Single Crystals," J. Appl. Cryst. 12 (1979) 49.

High Temperature Solution Growth

High temperature solution (HTS) growth is useful for growth of "difficult" materials that for various reasons are not amenable to growth by conventional bulk techniques wherein the crystal is grown directly from the melted target compound. The list below covers a number of cases that are relevant to PZT.

Non-congruent melting materials (including peritectic melting) are those where the compound of interest does not crystallize directly from a liquid of the same composition at a local maximum (or minimum) on the melting curve. While lead titanate is congruently melting (FIG. 1); lead zirconate is not (FIG. 2) in part because of the refractory nature of zirconia ($ZrO_2$—zirconium oxide) compounds. High melting point oxides are often outside the limits of bulk techniques because of limits on the use temperature of the crucible and other furnace materials or a high vapor pressure of a constituent.

Complex mixtures including solid solutions such as PZT and doped PZT have phase diagrams where the crystallizing compound can be very far off the melt composition.

Compounds with volatile constituents such as lead oxide may have to be equilibrated and grown at substantially lower temperatures than their melting point to be stable. It is preferred that the process temperature not exceed 900° C. This in turn limits the solubility of the crystal constituents.

HTS growth gives the ability to vary growth conditions including temperature, chemical environment and atmosphere so that unstable crystal materials can be stabilized. The crystal growth system consisting of the solvent, solute, crucible, atmosphere and furnace should be stable in every way possible.

High Temperature Solution Growth of PZT

HTS growth of lead zirconate titanate (PZT-$PbZr_xTi_{1-x}O_3$) crystals has been studied previously. The primary solvents have been so called "self-fluxes" with an excess of $PbO$[7,8,9] and fluoride solvents[10,11,12,13] KF, NaF and $PbF_2$ alone or in mixtures comprising one or more halide compounds and PbO, $Pb_3(PO_4)_2$ and/or $B_2O_3$. These studies include specific techniques of slow cooling, isothermal, localized cooling, solvent evaporation and top-seeded solution growth all of which require high solubility of PZT for success. The published experiments and results are summarized in Table III.

TABLE III

Growth parameters of HTS PZT crystal growth.

| Solvent | Method | T(start) | T(end) | Conc. | x (melt) | x (crystal) | Ref. |
|---|---|---|---|---|---|---|---|
| PbO (excess) | Isothermal | 1100° C. 1200° C. 1300° C. | Constant | Various | Various | Zr rich | [7] |
| PbO (excess) | Slow cool | 1170° C. | 950° C. | Various | FIG. 3 | FIG. 3 | [8] |
| PbO (excess) | Slow cool | 1170° C. | 950° C. | 0.15 | 0.4 | 0.06 | [9] |
| PbO—$B_2O_3$ (15:1) | Isothermal | 967-1017° C. | Constant | | | 0.65-0.93 +$PbTiO_3$ | [9] |
| PbO—$PbF_2$ (50:50 start 60:40 end) | Slow cool | 1200° C. | 800° C. | 0.15 | FIG. 4 | FIG. 4 | [10] |
| KF—$PbF_2$ (50:50 start 70:30 end) | Slow cool | 1200° C. | 800° C. | 0.15 | FIG. 5 | FIG. 5 | [10] |
| KF—$PbF_2$ | Slow cool | 1150° C. | 950° C. | 0.10 | Various | 0-0.4 and 0.85 | [11] |
| $(PbO)_{0.4}(PbMoO_4)_{0.6}$ | Slow cool | Various | Various | Various | 0.5 | 0.28 | [12] |
| $(KF)_{0.4}(PbF_2)_{0.6}$ | Slow cool | Various | Various | Various | 0.5 | 0.26 | [12] |
| $(NaF)_{1/3}(PbF_2)_{2/3}$ | Slow cool | Various | Various | Various | 0.5 | 0.4 | [12] |
| $(KF)_{0.30}(PbF_2)_{0.66}(Pb_3(PO_4)_2)_{0.04}$ | Slow cool | 1115° C. | 800° C. | 0.15 | 0.5 | 0.45 | [13] |

[7] S. Fushimi and T. Ikeda, "Phase Equilibrium in the System PbO—$TiO_2$—$ZrO_2$." *J. Am. Ceram. Soc.* 50: 119 (1967).
[8] R. Clarke and R. W. Whatmore, "The Growth and Characterization of $PbZr_xTi_{1-x}O_3$ Single Crystals," *J. Cryst. Growth* 33: 29 (1976).
[9] T. Hatanaka and H. Hasegawa, "Observation of Domain Structures in Tetragonal $Pb(Zr_xTi_{1-x})O_3$ Single Crystals by Chemical Etching Method," *Jpn. J. App. Phys.* 31: 3245 (1992).
[10] S. Fushimi and T. Ikeda, "Single Crystals of Lead Zirconate Titanate Solid Solutions," *Japan. J. Appl. Phys.* 3: 171 (1964).
[11] S. Fushimi and T. Ikeda, "Optical Study of Lead Zirconate-Titanate," J. Phys. Soc. Japan 20: 2007 (1965).
[12] K. Tsuzuki, et al., "Growth of Pb(Zr—Ti)$O_3$ Single Crystal by Flux Method," *Japan. J. Appl. Phys.* 7: 953 (1968).
[13] K. Tsuzuki, et al., "The Growth of Ferroelectric $Pb(Zr_xTi_{1-x})O_3$ Single Crystals," *Japan. J. Appl. Phys.* 12: 1500 (1973).

Various authors have also used a technique called flux growth, which differs from solution growth in that the constituents are not fully dissolved. In the flux method, crystal growth does not occur by nucleation and growth, but rather by transport of various nutrients between particulates that results in growth of larger crystallites at the expense of smaller ones. PbO—KF—$PbCl_2$ fluxes used for this application have very high vapor pressures at the growth temperature and as much as ⅔ of the flux may evaporate during the growth run.

None of these results reach the level of being a viable process for PZT crystal growth.

The resultant crystals were at most a few millimeters on a side and typically thin plates because of the inherent limitations of these crystal growth techniques. Point seeded methods must grow out in three dimensions, which is a very time consuming process compared to common bulk crystallization methods such as Bridgman and Czochralski where there is a planar crystal growth front. Such point-seeded methods inherently produce crystals with well-developed facets. Such facets are the slowest growth direction and typically only advance by some sort of step propagation or dislocation model.

High temperatures >900° C. result in high evaporation of PbF$_2$, PbO, KF, NaF and PbCl$_2$ among other species. Evaporation of one or more species gives a continuously varying chemical environment and unstable growth conditions.

Slow cooling over a temperature range inherently gives a wide variety of growth conditions that are undoubtedly the source of compositional variations. Those authors who do not report compositional variations may only be reporting on a limited sample of crystals or an average value yielded by the characterization method (e.g., x-ray powder diffraction).

None of the authors have measured the solubility of PZ and PT, or alternatively ZrO$_2$ and TiO$_2$, under the growth conditions. Therefore it is unknown at what saturation (liquidus) temperature any given melt composition may actually produce crystals. In fact, it is entirely possible that in some instances not all the zirconia or PZ is dissolved in the melt and any crystal growth may be occurring by the flux method rather than true HTS growth.

There are a diversity of Zr/Ti distribution coefficients seen both above and below unity depending on the choice of solvent, ZrO$_2$ fraction x relative to TiO$_2$ in the melt and other factors that are not properly recorded including actual growth temperature.

In some cases, phase separation into Zr-rich and Ti-rich phases is seen. One group observed a positive heat of mixing for PZT in a 3Na$_2$O-4MoO$_4$ solution. Such phase separation is not seen in solid phase sintering.

Therefore an inventive method is required that can sustain a uniform MPB composition and produce a planar crystal growth front to grow large crystals.

Freezing Point Depression (Cryoscopy)

Cryoscopy is the study of the properties of a multicomponent solution by the depression of the freezing point of one or more components. Typically it is used to measure the molecular weight or degree of dissociation of a small quantity of one component dissolved in a bulk liquid of another component.

If two melt constituents C and D in a binary melt do not form a solid solution (at least not to a significant extent), adding C to D in the liquid lowers the freezing point of a solid (presumably a crystal) of pure C because of the entropy of mixing in the C-D liquid solution. If the assumption is made that this is an ideal solution and the attractive forces between like and unlike atoms are the same, a derivation may be made from Raoult's Law and the Clausius-Clapeyron equation that yields $$\ln(X_C) = -\frac{\Delta H_f}{nR}\left(\frac{1}{T} - \frac{1}{T_M}\right) \quad (1)$$

where $X_C$ is the mole fraction of C, $\Delta H_f$ is the enthalpy of fusion of C, n is the Van 't Hoff factor, R is the gas constant, $T_M$ is the melting temperature of a pure C melt and T is the liquidus temperature of the diluted solution in K where the first appearance of a solid phase occurs.

The Van 't Hoff factor n is nominally the number of particles into which D dissolves in an ideal solution of C that are distinct from the particles into which C melts in solution. In a non-ideal solution n may take on a wider range of values depending on whether the atoms or complexes of D are attracted (smaller n) or repelled (greater n) by one another. n of D can be different for different C components depending on the nature of the liquid.

Liquid Phase Epitaxy

Epitaxy is when a crystal of one material is grown on top of and in registry with another material. Liquid phase epitaxy (LPE) is depicted atomistically in FIG. 6 and pictorially in FIG. 7. Other HTS techniques such as slow cooling, localized cooling, solvent evaporation and top-seeded solution growth require high solute concentrations and typically involve cooling over a wide temperature range such that the thermodynamic conditions vary significantly with the common result that the crystal composition also varies. LPE is unique in that it is a near equilibrium high temperature solution growth technique undertaken at near constant growth conditions from a relatively dilute melt. Accordingly, high crystal quality at constant target stoichiometry can be achieved with the proper match between film and substrate.

To grow quality crystals, the film and substrate must have an acceptable match in structure, lattice parameter and coefficient of thermal expansion. Congruently melting substrate crystals growable by some bulk method can be matched up with non-congruent films that must be grown by HTS techniques to produce film/substrate combinations with effective composite properties. The substrate must be of good crystal quality as any defects will propagate into the film. Compared to point-seeded methods, LPE has a high volumetric growth rate because the crystal only needs to expand in one dimension with a planar growth front. Compared to vapor phase methods, there is a much higher flow of nutrient, so thicker films are practical at higher growth rates and, in fact, for a good enough coefficient of thermal expansion match, film thicknesses can be achieved that are of similar magnitude to the substrate thickness, effectively growing bulk crystal plates that can be made free-standing by removing the substrate through lapping and polishing. LPE is best conducted from a more dilute melt so homogeneous nucleation of crystallites is avoided and crystal growth can be controlled at a variety of undercoolings. LPE is also best done at the lowest possible temperature to achieve the desired phase as close as possible to equilibrium. In particular, anti-site defects are avoided at lower growth temperatures. The solvent must wet the substrate for good growth.

LPE has reached its zenith to date in the HTS growth of magnetic garnets on Czochralski-grown non-magnetic garnet substrates for thin-film magnetic bubble and thick-film magnetooptic applications. LPE has been shown to be a practical high throughput technique for the growth of thick film garnet Faraday rotator materials (~500 μm films) with only ~1 mol % of the limiting rare earth oxide. The garnet system is similar to perovskites in that the materials are adaptable because the crystal structure is defined by a network of oxygen atoms.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In one aspect, a method is provided of growing a lead zirconate titanate (PZT) single crystal having room temperature PZT lattice parameters comprising a=4.03±0.02 Å, c=4.15±0.02 Å and b=4.08±0.02 Å or b=a using liquid phase epitaxy, comprising:

providing a substrate in a solution, wherein the substrate has a perovskite crystal structure and one or more periodic repeat distances in the plane of growth that are integer multiples of the PZT periodic repeat distances of the same crystal orientation to within 2%, and wherein the solution comprises a solvent and a solute, and wherein the solute comprises PZT or PZT precursors PbO, $TiO_2$, $ZrO_2$, $PbZrO_3$ (PZ) and $PbTiO_3$ (PT); and growing the PZT single crystal from the solution onto the substrate using liquid phase epitaxy, wherein the temperature of the solution is held to within 25° C. of a constant growth temperature.

In another aspect, a method of growing an epitaxial perovskite single crystal is provided, comprising providing a substrate in a solution, wherein the substrate comprises a composition selected from the group consisting of a relaxor composition and a ferroelectric composition.

In another aspect, a piezoelectric device is provided, comprising a PZT single crystal formed according to the disclosed methods. Such piezoelectric devices include a transducer, a receiver, a sensor, and an actuator.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 6: Schematic depictions of LPE at the atomistic scale.

FIG. 7: Cut-away view of a liquid phase epitaxial crystal growth furnace.

DETAILED DESCRIPTION

Figure 1:
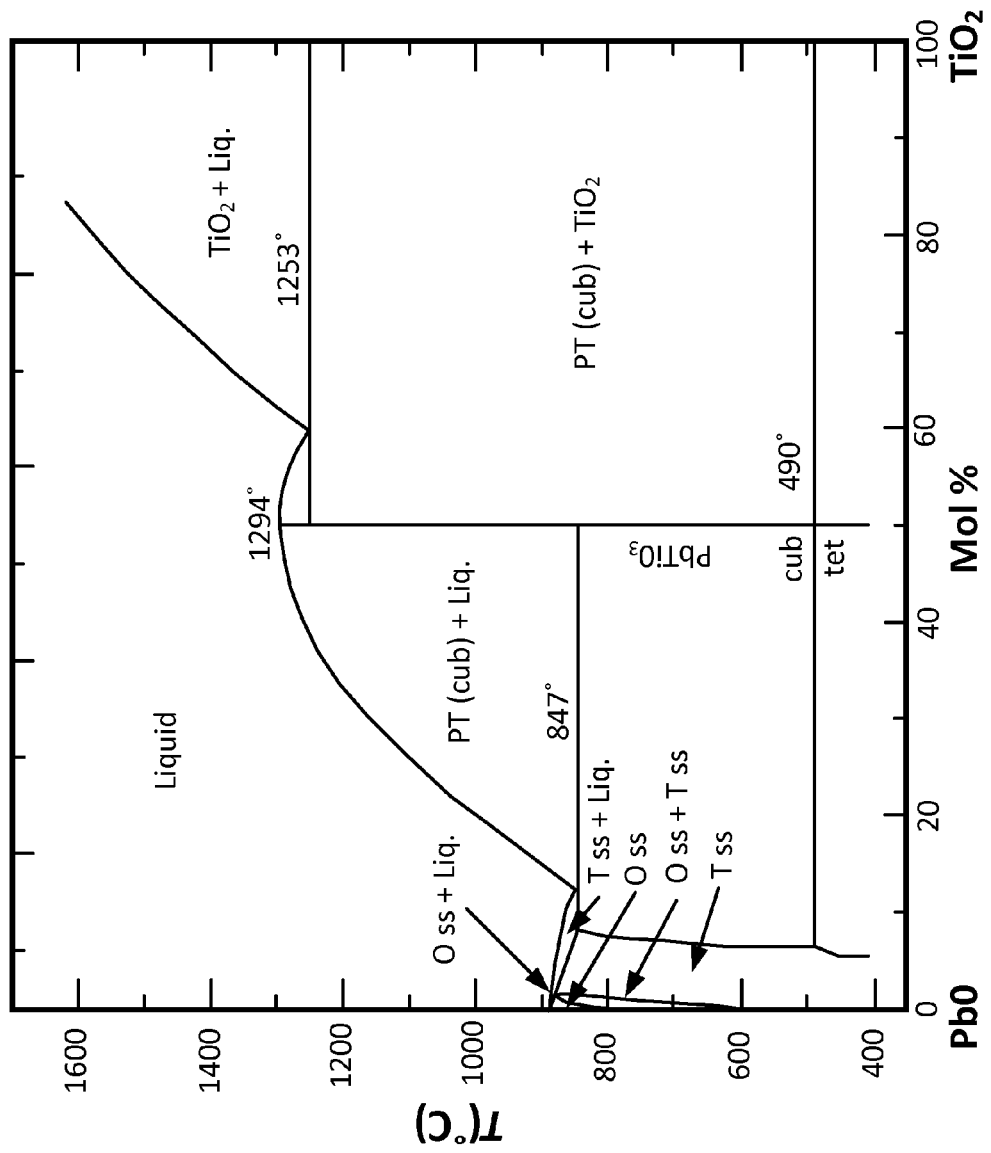
FIG. 1: PbO—$TiO_2$ phase diagram showing congruently melting $PbTiO_3$ at a temperature maximum.

Growth of single crystals of lead zirconate titanate (PZT) and other perovskites is accomplished by liquid phase epitaxy onto a substrate of suitable structural and lattice parameter match. A solvent and specific growth conditions for stable growth are required.

In one aspect, a method is provided of growing a lead zirconate titanate (PZT) single crystal having room temperature PZT lattice parameters comprising a=4.03±0.02 Å, c=4.15±0.02 Å and b=4.08±0.02 Å or b=a using liquid phase epitaxy, comprising:

providing a substrate in a solution, wherein the substrate has a perovskite crystal structure and one or more periodic repeat distances in the plane of growth that are integer multiples of the PZT periodic repeat distances of the same crystal orientation to within 2%, and wherein the solution comprises a solvent and a solute, and wherein the solute comprises PZT or PZT precursors PbO, $TiO_2$, $ZrO_2$, $PbZrO_3$ (PZ) and $PbTiO_3$ (PT); and growing the PZT single crystal from the solution onto the substrate using liquid phase epitaxy, wherein the temperature of the solution is held to within 25° C. of a constant growth temperature.

The method proceeds according to traditional LPE techniques known to those of skill in the art. Unique to the claimed method is the selection of substrate, solvent, and solute.

As used herein, the "solution" is defined as the combined solute and solvent. As used herein, the solute is the compound that is dissolved in the solvent and crystallizes as the resultant crystal. The solute may be dissolved as the desired crystal compound or as individual constituents of the desired crystal compound.

As used herein, the "solvent" is the substance that dissolves the solute and is not incorporated significantly in the resultant crystal. The solvent may consist of a single substance or a mixture of substances and may include one or more constituents of the crystal, e.g., PbO. On the solvent branch of the melting curve, addition of the solute depresses the melting temperature of the solvent. On the solute branch of the melting curve, addition of the solvent depresses the melting temperature of the solute. If there are no intermediate compounds, the two curves meet at the minimum eutectic temperature and thereby define the liquidus. Crystallization of the solute as the first phase to solidify from the liquid occurs on the solute liquidus branch of the melting curve. It is desirable that the eutectic be at as low a temperature as possible and as close to the solvent end of the phase diagram as possible.

Substrate Materials Overview

In choosing a substrate, the material should meet a plurality of the following constraints. In one embodiment, the substrate meets all of these constraints.

Structural, lattice parameter and coefficient of thermal expansion match to the desired film composition within ~2% (0.08 Å here). A better match preferably within 0.25% or 0.01 Å of the lattice parameter of the material to be deposited may be needed to prevent the formation of misfit dislocations. PZT has multiple orthogonal or near-orthogonal lattice parameters (Table I) as do some of the substrate materials. The orientation of the substrate must comprise a lattice match to the lattice spacing(s) in the plane of the film. It is necessary that the film and substrate have a sufficiently close (2% or better) lattice match at the growth temperature where both PZT and many of the substrate crystals have transformed to a cubic structure. It is also desirable that the film and the substrate have a close lattice match at room temperature, through close match of thermal expansion coefficients, which is more easily measured and specified. Those knowledgeable in the art will understand that the non-degeneracy of the crystal directions and potential twinning of substrate and film will proceed on cooling according to the cooling program, the anisotropic stress field of a disc and the stress between the film and the substrate. The latter will evolve to minimize the stress energy and give the best possible match. Following growth, poling in an electric field may be used to improve or impose a specific match.

Chemical compatibility with the film. No or minimal interdiffusion or reaction is allowed.

Compatible with the chosen LPE solvent. Low solubility and/or dissolution rate so film growth is highly favored over substrate dissolution. Common constituents among the film and substrate help to attain this.

Of good quality with a low dislocation density so such defects are not propagated into the film. It should be polished to an epitaxial quality surface with no subsurface damage and good flatness.

No destructive phase transition between room temperature and the LPE growth temperature. It is understood that the non-destructive phase transitions of these ferroelectric materials occur by preferential displacement of octahedral atoms, not from shearing transitions. Thus multi-domain regions of nominally different crystal directions easily coexist without fracture.

No constituents that would fatally contaminate the film should any breakage and dissolution occur.

Made from low cost chemicals.

No properties harmful to device operation if it is to be part of the final device.

Growable by some large-scale bulk process, preferably the Czochralski or Bridgman methods. This contains its own set of constraints.

The substrate constraints of growability and lattice match to the film are overriding for successful LPE.

In one embodiment, the substrate has at least one substrate room temperature lattice parameter in the range 4.05±0.04 Å or a multiple of 4.05±0.04 Å by 2 or √2.

In one embodiment, the substrate is selected from the group consisting of $NdScO_3$, $PrScO_3$, $Sr(Na_{1/4}Ta_{3/4})O_3$, $Sr(Na_{1/4}Nb_{3/4})O_3$, $Ba(Fe_yNb_{1-y})O_3$, $Ba(Fe_yTa_{1-y})O_3$, $Ba(Mn_yNb_{1-y})O_3$, $Ba(Mn_yTa_{1-y})O_3$, $Ba(Ni_yNb_{1-y})O_3$, $Ba(Ni_yTa_{1-y})O_3$.

Strontium titanate has been most commonly used for vapor phase epitaxy (VPE) of piezoelectric perovskite thin films, often with one or more buffer/lattice matching layers. However, it has a high lattice mismatch (3-6.5%) to PZT and PMN-PT that is tolerated by VPE thin films, but not by LPE thick films. PZT has been grown epitaxially from a vapor, but never from a liquid.

A different solid solution between the relaxor $PbZn_{1/3}Nb_{2/3}O_3$ and the ferroelectric lead titanate $PbTiO_3$ has been grown by LPE on a strontium titanate substrate. In spite of having similar looking acronyms, the chemical difference between PZN-PT and PZT is profound especially as $ZrO_2$ is a high melting refractory and ZnO dissolves much more readily in a PbO based solvent.

Figure 8:
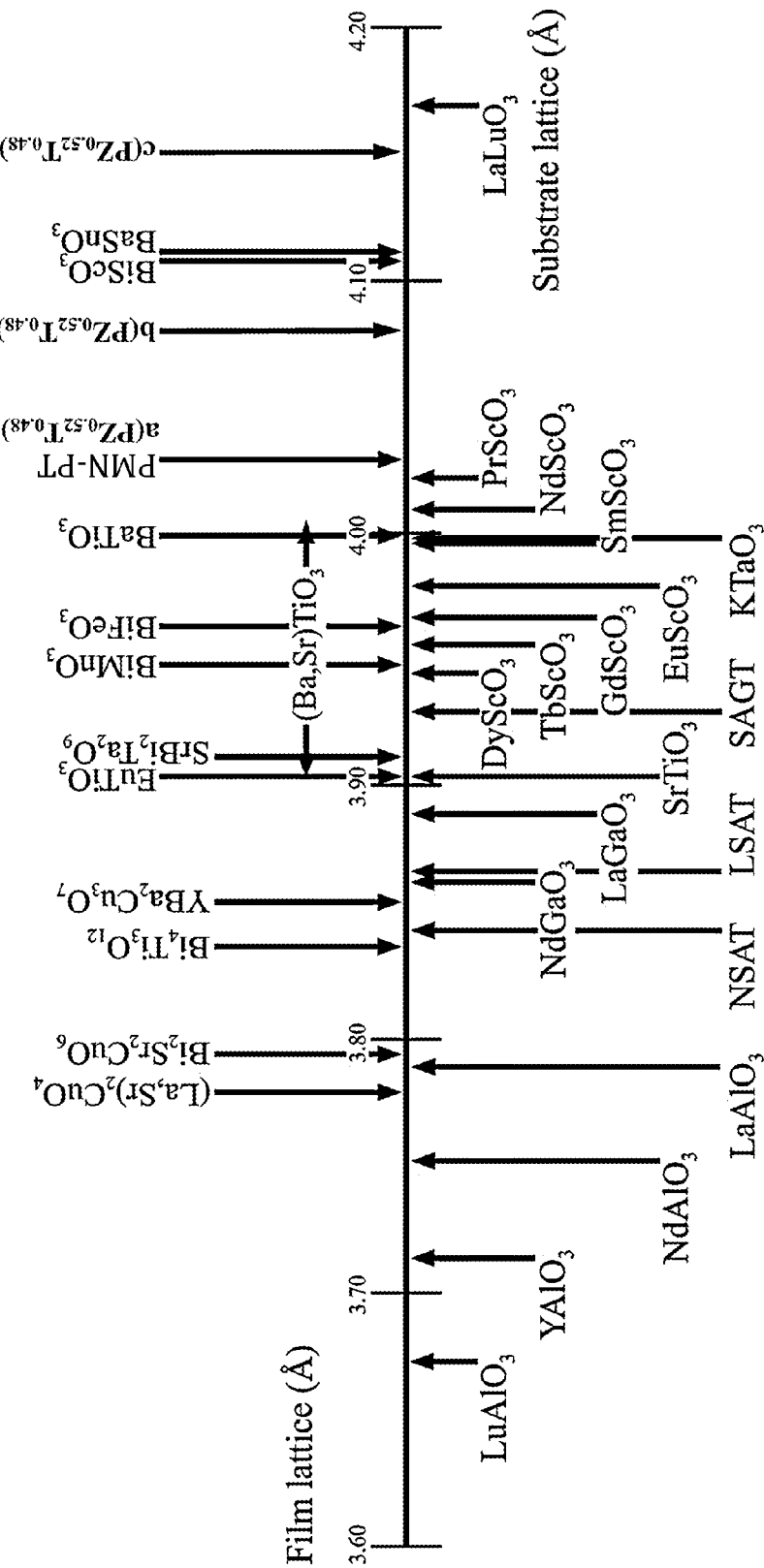
FIG. 8: Lattice parameters of desired epitaxial film perovskites (above) and currently available substrate materials (below). (After Schlom)

FIG. 8 shows the lattice parameters of the available perovskite substrates (bottom of FIG. 8) and epitaxial thin film compounds of interest that might be grown on them (top of FIG. 8). FIG. 8 shows a clear gap in available substrate materials between $PrScO_3$ (~4.027 Å) and $LaLuO_3$ (~4.17 Å) that is right where substrates would be needed to match the b and c lattice parameters of PZT.

Relaxor Substrates

In one embodiment, the substrate comprises a composition selected from the group consisting of a relaxor ferroelectric composition and a normal ferroelectric composition. It is understood that this may include a crystal substrate of a pure relaxor ferroelectric with zero admixture of a normal ferroelectric.

In one embodiment, the substrate is grown by the Bridgman method.

In one embodiment, the normal ferroelectric composition comprises lead titanate with an approximate composition of $PbTiO_3$ (PT).

Materials comprising all three of the embodiments above are technologically important for other applications and therefore already have a well-developed method of production of high quality crystals. They also have a close structural and lattice match to the desired morphotropic phase boundary (MPB) composition of PZT at room temperature. At the high temperature used for crystal growth, they will have a cubic crystal structure and therefore by definition be untwinned. Because of common constituents with the film they are expected to have a similar coefficient of thermal expansion to PZT, will be chemically compatible with the film and will contaminate the melt much less if broken and dissolved in the melt. They therefore have most of the ideal substrate characteristics. The target composition of this process is the MPB composition where the crystal structure readily transforms among multiple structures and occurs in the center of the grown crystal boule. The normal production method for these crystals produces scrap rhombohedral bottoms and tetragonal tops outside the MPB range that are of stable structure at room temperature and cannot be used for the intended application of the MPB crystal. These materials represent an ideal resource for substrate crystals in the present invention that is not currently being exploited in any way.

In one embodiment, the relaxor ferroelectric composition comprises lead magnesium niobate with an approximate composition of $PbMg_{1/3}Nb_{2/3}O_3$ (PMN). PMN-PT is the most highly commercialized of the relaxor ferroelectric-normal ferroelectric single crystals. Because it is not a solid solution, pure PMN can be grown as a uniform crystal by the Bridgman method and has an excellent lattice match to the MPB composition of PZT. The solid solutions PMN-PT have slightly inferior, but still good lattice matches to PZT.

In one embodiment, the relaxor composition comprises lead indium niobate with an approximate composition of $PbIn_{1/2}Nb_{1/2}O_3$ (PIN).

In one embodiment, the relaxor composition comprises lead ytterbium niobate with an approximate composition of $PbYb_{1/2}Nb_{1/2}O_3$ (PYN).

In one embodiment, the relaxor composition comprises a mixture of lead magnesium niobate and lead indium niobate. The commercial products using PIN are ternary solid solution crystals of PIN-PMN-PT (PIMNT). These ternary solid solutions have an even better lattice match to the MPB composition of PZT than PMN-PT.

In one embodiment, the relaxor composition comprises a mixture of lead magnesium niobate and lead ytterbium niobate. Experimentally quantities of PYN-PMN-PT (PYMNT) and other ternary relaxor ferroelectric-normal ferroelectric compositions have been grown.

Rare Earth Scandates

The rare earth scandates $REScO_3$ are shown as substrate materials in FIG. 8. These have been used for vapor phase deposition of perovskite layered films of various functional oxides. Rare-earth scandate data is reported in Table IV. Neodymium scandate is commercially available, but a still better lattice match to PZT is preferred. Praseodymium scandate can be produced and is available in experimental quantities. $LaScO_3$ is not considered growable by the Czochralski method because of too high a melting temperature >2200° C. that poses risk for melting of iridium crucibles. Scandium is classed as a rare earth and is very expensive. This is also true for lutetium so $LaLuO_3$ (also only available in experimental quantities) is very expensive as well. It is not known how the lattice structure of these materials evolves on heating, but they do not go through a destructive phase transition.

TABLE IV

Lattice parameters a, b and c of some rare earth scandium perovskites. The lattice match of these structures to PZT requires viewing them on the diagonal $(a + b)/2\sqrt{2}$. The a/b ratio defines the degree of in-plane distortion and the tolerance factor T defines how easily this perovskite forms; values of T and a/b closer to 1 tend to be of higher symmetry closer to cubic.

| Crystal | a(Å) | b(Å) | c(Å) | $(a + b)/2\sqrt{2}$(Å) | c/2(Å) | a/b | T |
|---|---|---|---|---|---|---|---|
| $DyScO_3$ | 5.440 | 5.717 | 7.903 | 3.946 | 3.952 | 0.952 | 0.857 |
| $TbScO_3$ | 5.466 | 5.731 | 7.917 | 3.960 | 3.959 | 0.954 | 0.860 |
| $GdScO_3$ | 5.480 | 5.746 | 7.932 | 3.970 | 3.966 | 0.954 | 0.867 |
| $SmScO_3$ | 5.527 | 5.758 | 7.965 | 3.991 | 3.983 | 0.960 | 0.870 |
| $NdScO_3$ | 5.575 | 5.776 | 8.003 | 4.014 | 4.002 | 0.965 | 0.880 |
| $PrScO_3$ | Unpublished | | | ~4.027 | | | 0.890 |
| $LaScO_3$ | 5.678 | 5.787 | 8.098 | 4.054 | 4.049 | 0.981 | 0.910 |

Melt and Growth Conditions

Successful crystal growth occurs under certain conditions, specifically comprising melt composition, atmosphere, crucible material, temperature, pressure and possibly other variables. All these variables constitute a very complex multi-dimensional phase diagram. This may be simplified by fixing some variables such as growth in air at 1 atmosphere from a platinum crucible. This still leaves the melt composition and temperature. LPE is conducted at a small and constant undercooling from the melting, liquidus or saturation temperature $T_S$ at which growth of a solid phase is thermodynamically favored. This means that the growth temperature for any melt composition is defined by the liquidus surface of the phase diagram. Therefore the growth conditions must be defined by a melt composition from which stable growth of the desired composition may be achieved. Instability in the form of evaporation or selective depletion of one or more constituents must be avoided.

The phase diagram among PbO, $ZrO_2$, $TiO_2$, at least two intermediate phases $PbZrO_3$ and $PbTiO_3$ and additional solvent ingredients is complex. In understanding the invention it is useful to think of binary phase diagrams where C is the solute and D is the solvent. There is much less thermodynamic data for $PbZrO_3$ and $PbTiO_3$, than for $ZrO_2$ and $TiO_2$ so this discussion will be based on binary phase diagrams between C=$ZrO_2$ or $TiO_2$ and D=solvent, which may be a single compound or a mixture. $ZrO_2$ and $TiO_2$ are more refractory with much higher melting temperatures than the solvents of interest, which are, by the nature and advantages of HTS, of low melting temperature. The binary phase diagram will be dominated by the melting curves of the more refractory component with the eutectic or minimum temperature close to the solvent side of the phase diagram. Once again this is desirable and necessary for HTS and even more so for LPE. Growth of the desired phase must occur on the solute branch of the melting curve, not on the solvent side where the solvent will be the first phase to solidify. The melting behavior of the solute can be approximated by Equation (1) and the solvent acting as the diluting species, even though that is the opposite of how growth is conventionally interpreted (solute dissolved in solvent). Extrapolation of Equation (1) to the extremely concentrated regime where $X_C \ll X_D$ exceeds the normal bounds of theory, but is a useful way to understand the data.

Equation (1) can be rearranged to yield $$\frac{1}{T} = \frac{1}{T_M} - \frac{nR}{\Delta H_f}\ln(X_C) \qquad (2)$$

which can be used to fit existing data in the literature or $$T = \frac{1}{\frac{1}{T_M} - \frac{nR}{\Delta H_f}\ln(X_C)} \qquad (3)$$

which can be used to construct a conventional phase diagram liquidus curve.

Figure 2:
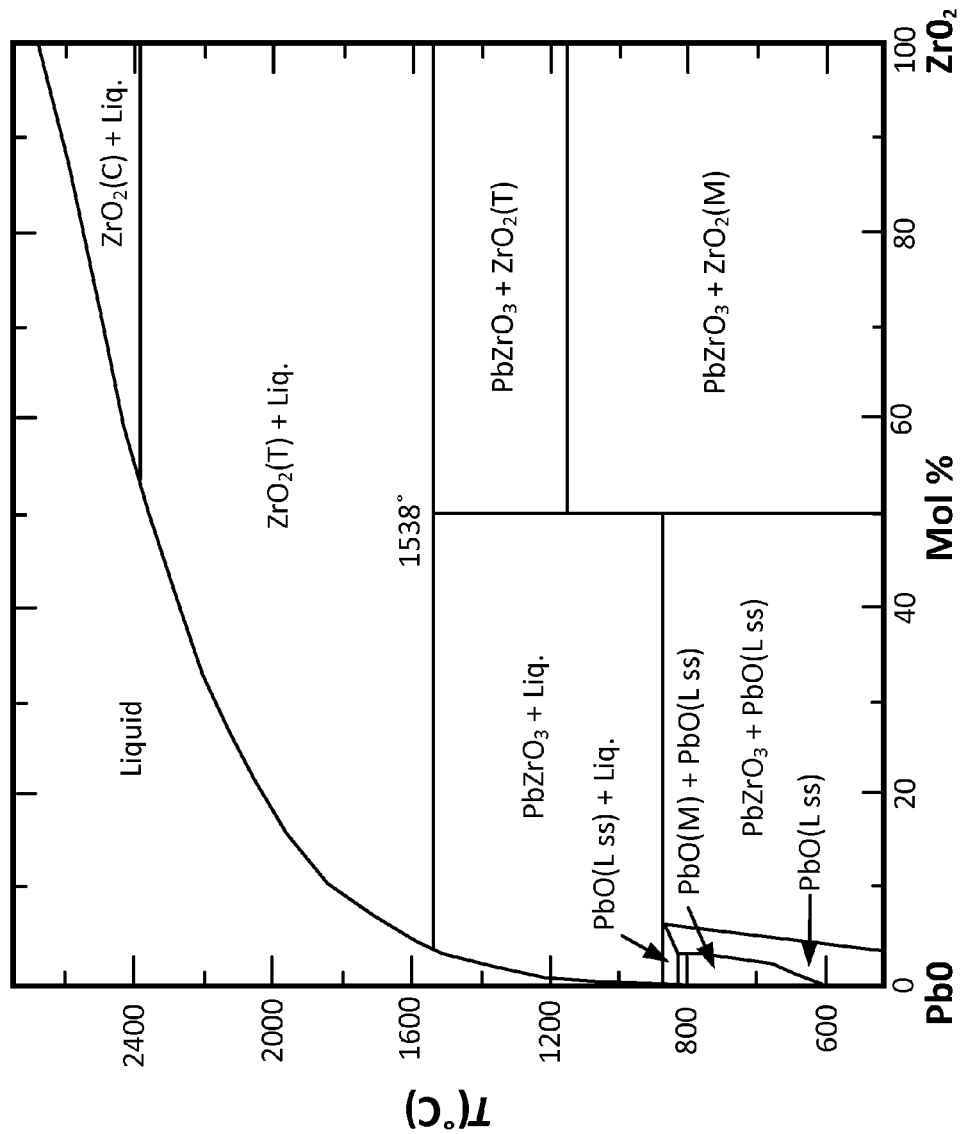
FIG. 2: PbO—$ZrO_2$ phase diagram showing incongruently melting $PbZrO_3$.
Figure 3:
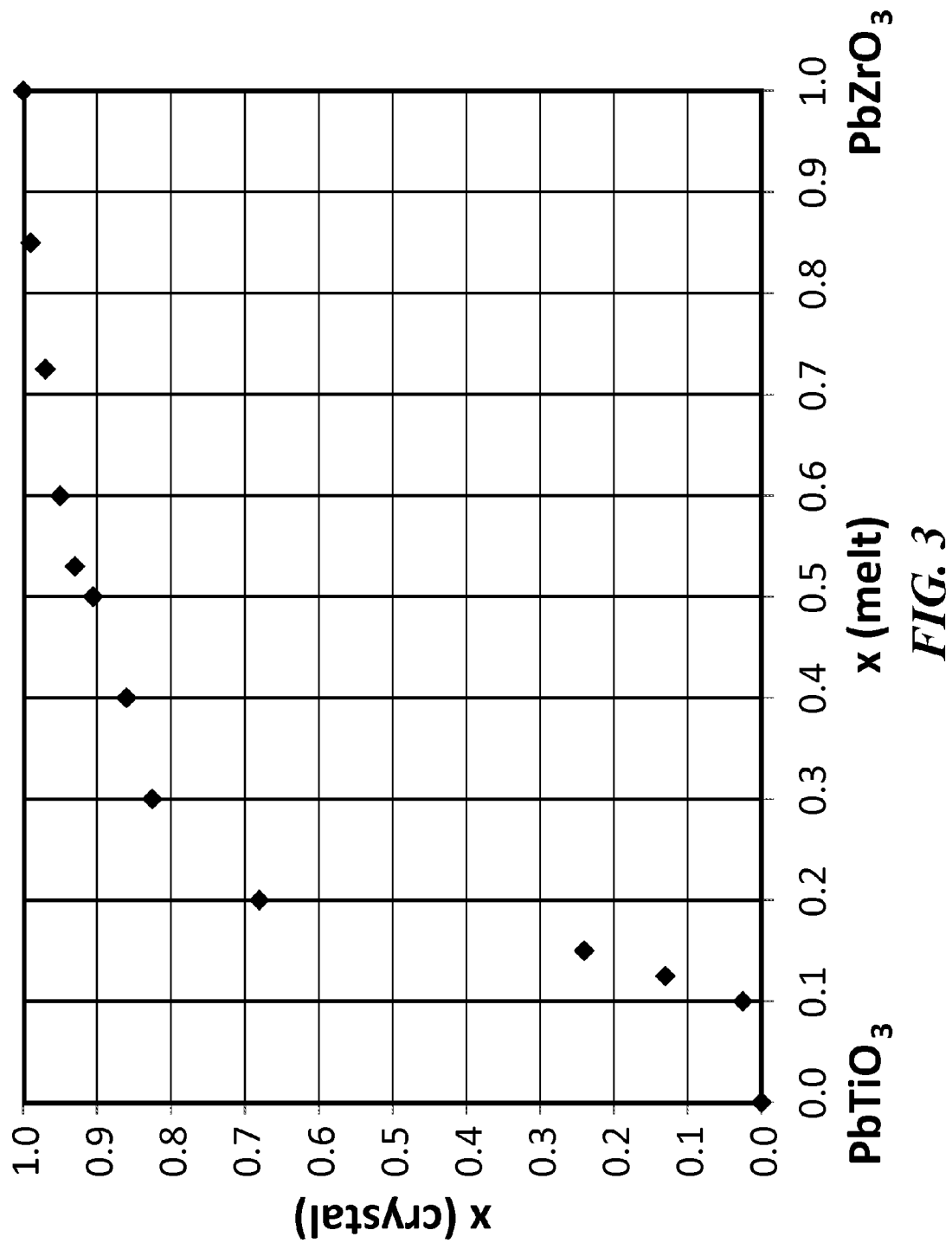
FIG. 3: Data for PZT in a solution of excess PbO. Crystal compositions were determined from lattice parameters and ferroelectric transition temperatures and therefore could be averages of multiple compositions or composition gradients. The transition between Ti-rich and Zr-rich regions is very close to the $PbTiO_3$ end.
Figure 4:
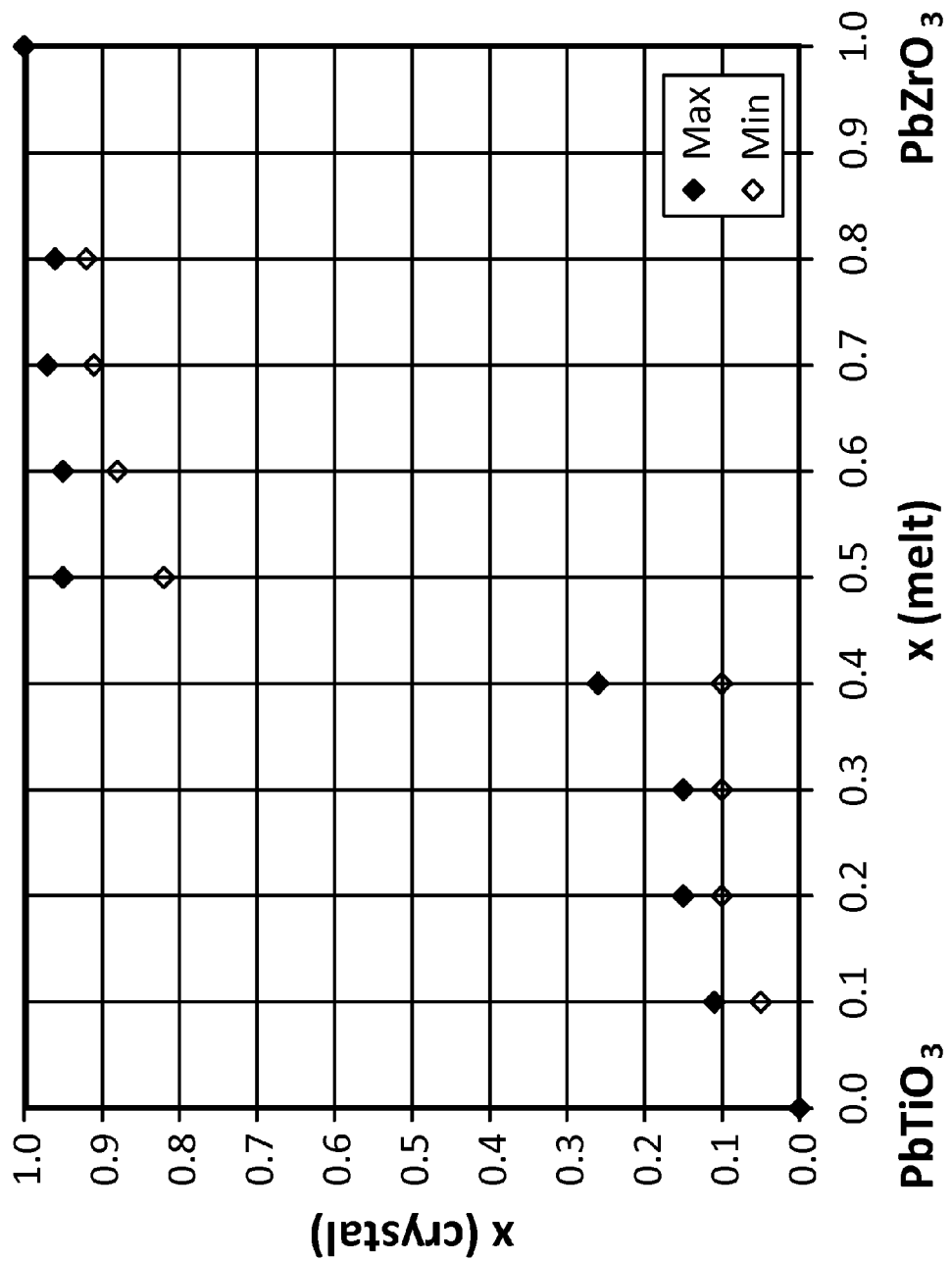
FIG. 4: Data for PZT (15 mole %) in a solution of PbO—$PbF_2$ and cooled from 1200 to 800° C. The initial solvent composition was 50-50, but was 60-40 at the end of the experiment through preferential evaporation of $PbF_2$. Crystal compositions were determined from optical observation of ferroelectric transition temperatures and therefore a range of temperatures indicated a range of compositions as shown here by the minimum and maximum values observed. Phase separation to Ti and Zr-rich phases and transition between regimes is observed at an equimolar melt concentration x=0.5.
Figure 5:
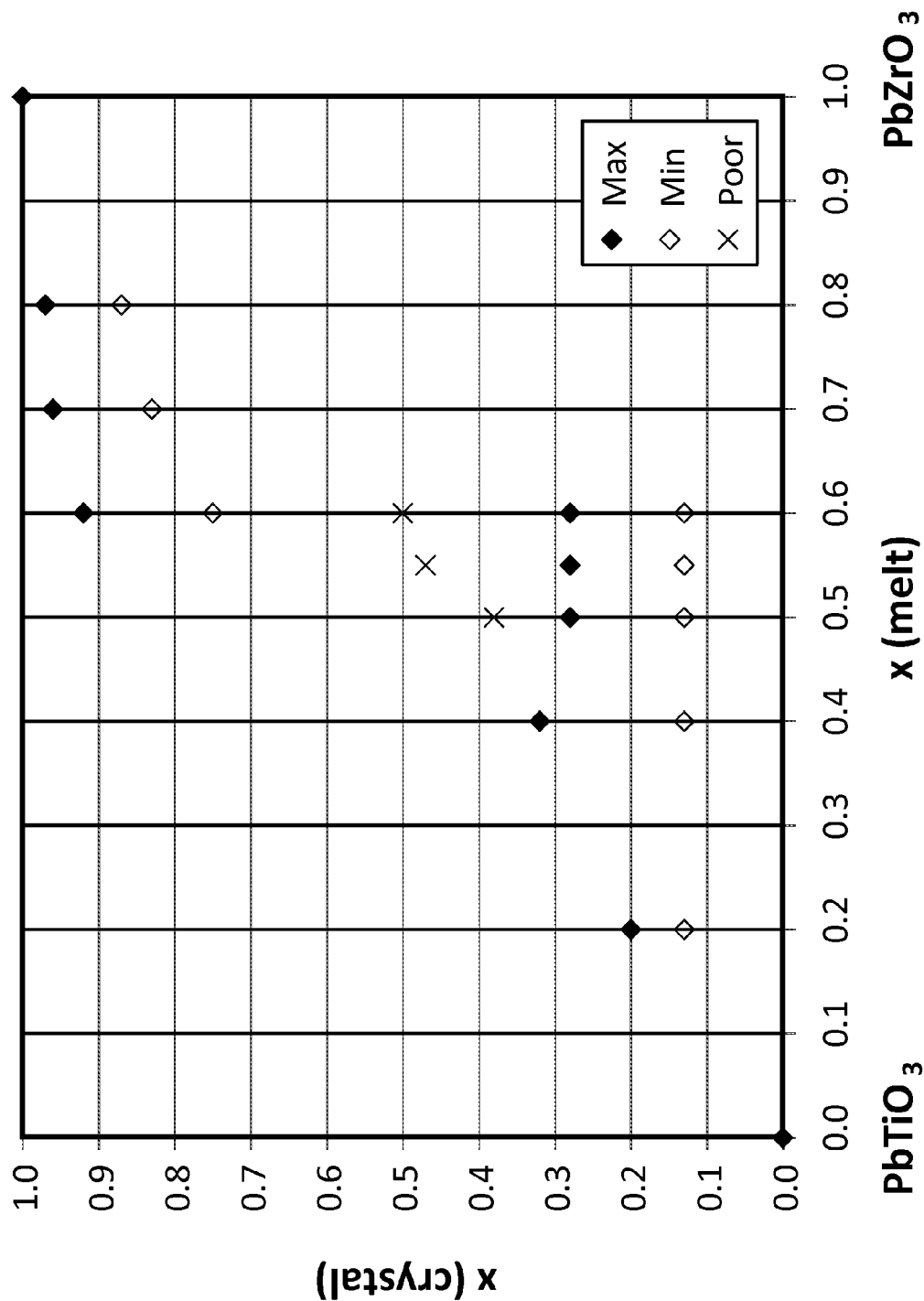
FIG. 5: Data for PZT (15 mole %) in a solution of KF—$PbF_2$ and cooled from 1200 to 800° C. The initial solvent composition was 50-50, but migrated to 70-30 at the end of the experiment through preferential evaporation of $PbF_2$. Crystal compositions were determined from optical observation of ferroelectric transition temperatures and therefore a range of temperatures indicated a range of compositions as shown by the minimum and maximum values observed. Phase separation to Ti and Zr-rich phases is observed at melt concentrations x=0.55-0.6. This compositional range also has some poor quality crystals (labeled x) that appear to have intermediate compositions between the Ti and Zr-rich fields. These may precipitate from the melt at temporary conditions that allow a more complete solid solution.
Figure 9:
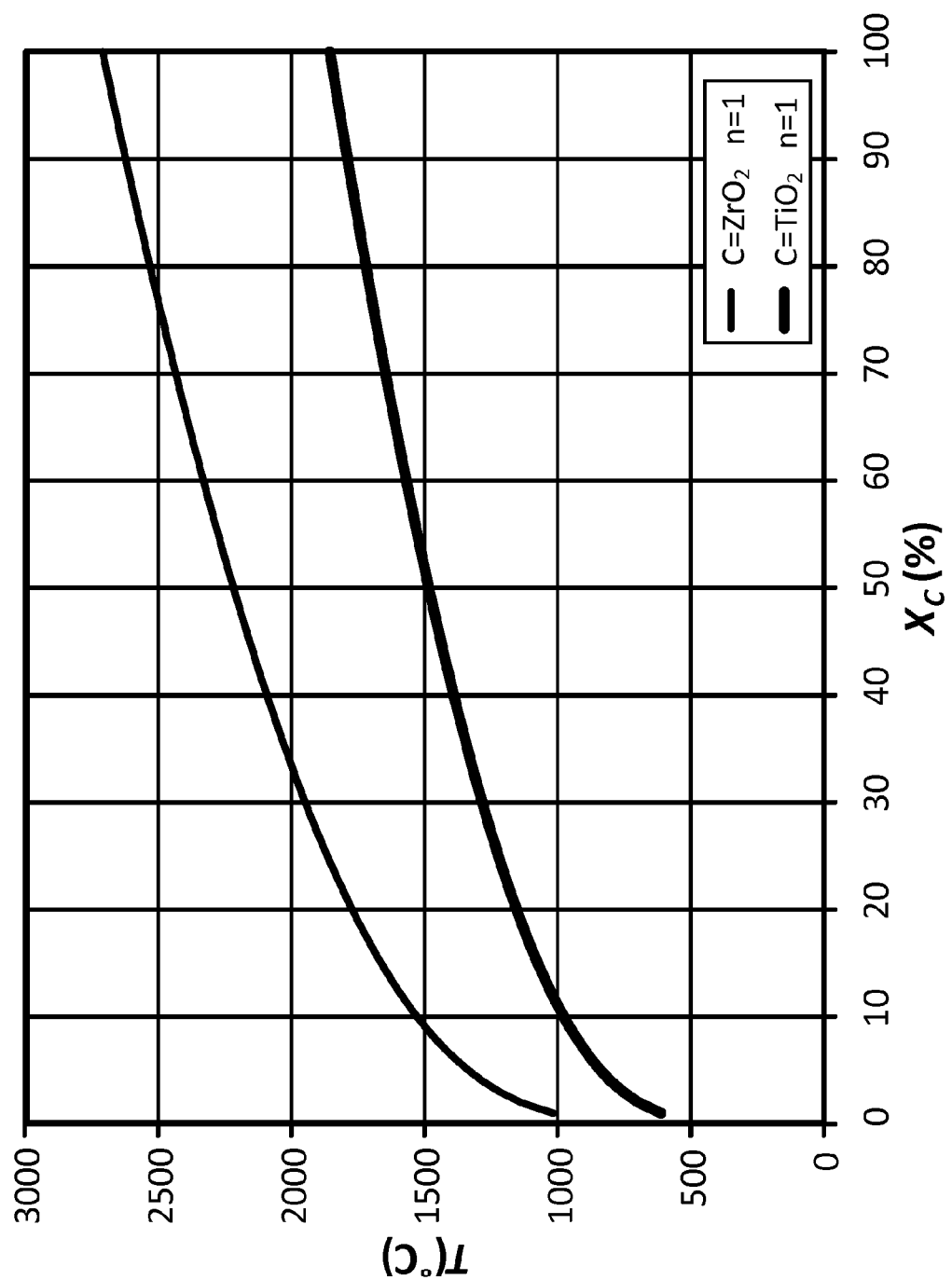
FIG. 9: Calculated liquidus curves of $ZrO_2$ and $TiO_2$ in an arbitrary single particle (n=1) solvent D according to Equation (3).

If C is $TiO_2$, the literature gives the values $R/\Delta H_f \approx 0.001434$ $K^{-1}$ and $T_M \approx 1855°$ C. (2128K). If C is $ZrO_2$, the literature gives the values $R/\Delta H_f \approx 0.0000955$ $K^{-1}$ and $T_M \approx 2709°$ C. (2982K). There is some variation in reported values of all these numbers. FIG. 9 depicts Equation (3) for C=$ZrO_2$ and $TiO_2$ and n=1. These curves are similar to what is seen in FIGS. 1 and 2 where the solvent D is PbO. For simplicity in the following, $ZrO_2$ and $TiO_2$ will be abbreviated as Zr and Ti.

If $X_{Zr}=X_{Ti}$, traveling vertically down the phase diagram as if cooling, it is clear that the solidus for $ZrO_2$ is reached at a temperature well above that for $TiO_2$ so the first phase that precipitates will be a Zr-rich phase; $ZrO_2$ here or $PbZr_xTi_{1-x}O_3$ with x significantly greater than 0.5 for the PZT phase diagram. The driving force for each component $ZrO_2$ (or PZ) and $TiO_2$ (or PT) to crystallize will depend on the undercooling with respect to the saturation curve for that component at the specific concentration of that component and the growth temperature.

The distribution coefficient of zirconia with respect to titania $K_{Zr}$, showing the relative fractions of Zr versus Ti in the crystal and in the melt is defined as $$K_{Zr} = \frac{x}{\frac{X_{Zr}}{X_{Zr}+X_{Ti}}} \quad (4)$$

which in this case of FIG. 9 or FIG. 1-FIG. 2 is greater than 1. Rearranging Equation (4) yields $$x = \frac{K_{Zr}(X_{Zr}+X_{Ti})}{X_{Zr}} \quad (5)$$

where $K_{Zr}$ is dependent on the crystallization temperature, which is in turn dependent on the melt composition. For any desired x and growth temperature T, a specific pair $X_{Zr}$ and $X_{Ti}$ are required to give that ratio at the same temperature and precipitate an equimolar crystal with x=0.5.

If viewing the phase diagram at constant temperature, only a very low Zr composition will have the same saturation temperature as a higher concentration Ti composition. At a sufficiently low Zr fraction x in the melt, $K_{Zr}<1$ may even be preferred.

Prior art researchers have not determined thermodynamic data that would allow a choice of growth conditions to optimize growth of the desired composition. The choice of essentially a random point on the phase diagram in terms of $X_{Zr}$ and $X_{Ti}$ concentrations and growth temperature (if isothermal) or temperature range (if slow cooling) has predictably resulted in a random crystal composition or compositions. The strong separation of the two solubility curves makes the desired approximately equimolar PZT crystal near the MPB almost impossible to grow to any significant size before the growth conditions leave the region where x≈0.5. Constantly varying growth conditions through cooling, depletion and evaporation have exacerbated this.

Therefore an improved understanding is required to see whether there is a solvent and set of growth conditions that results in improved crystallization behavior. The present invention in part comprises a cryoscopic study to determine if there are circumstances where the cryoscopic constants n of a given solvent or class of solvents in $ZrO_2$ and $TiO_2$ differ such that coincidence of the liquidus curves can be achieved.

The ACerS-NIST Ceramic Phase Equilibria Diagrams provide a data mine of binary phase diagrams with $C=ZrO_2$ and $TiO_2$ from which a number of eutectic data points in composition and temperature may be extracted. Those data are of varying accuracy and comprise a large number of diluting materials D. The following utilizes that data.

Figure 10:
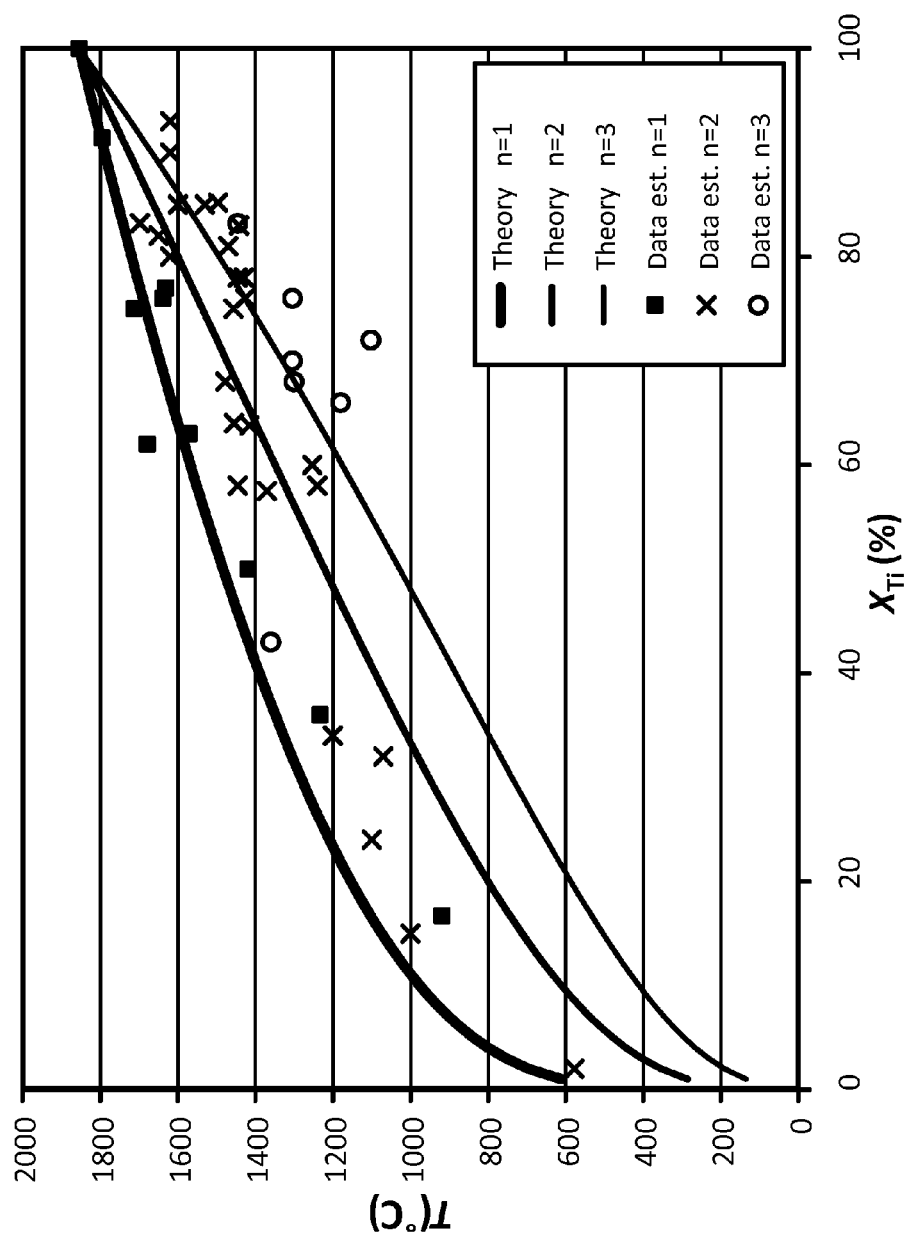
FIG. 10: Eutectic data (points) for C=$TiO_2$ compared to Equation (3) with n=1, 2 and 3 (lines). Data points are grouped by expected n.
Figure 11:
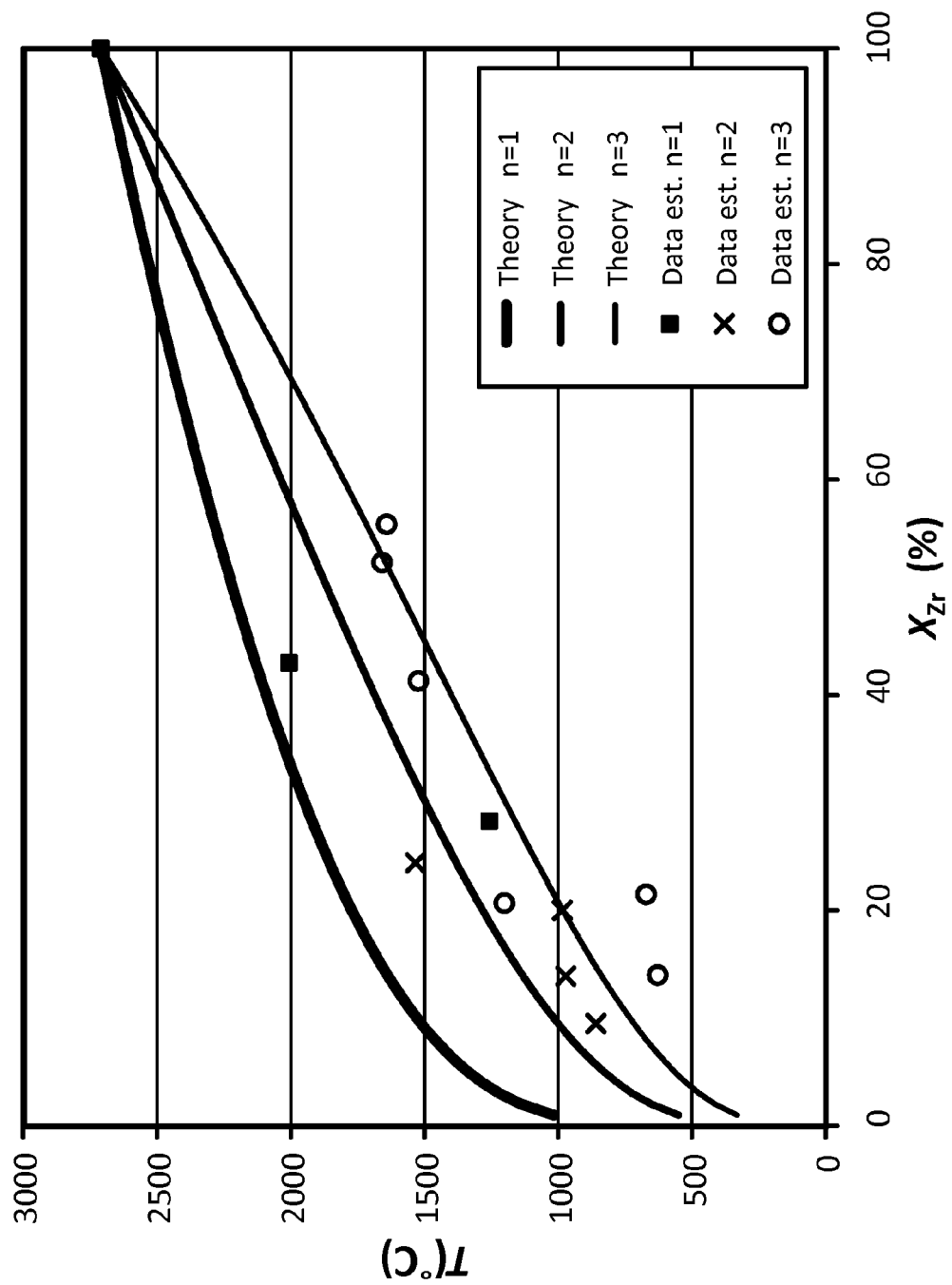
FIG. 11: Eutectic data (points) for C=$ZrO_2$ compared to Equation (3) with n=1, 2 and 3 (lines). Data points are grouped by expected n.

FIGS. 10 and 11 show the raw data for $TiO_2$ and $ZrO_2$ with the nominal Equation (3) curves for n=1, 2 and 3. The data are grouped by the expected n, but the scatter shows that the actual n varies considerably. The following shows that this is systematic and can be used inventively.

Figure 12:
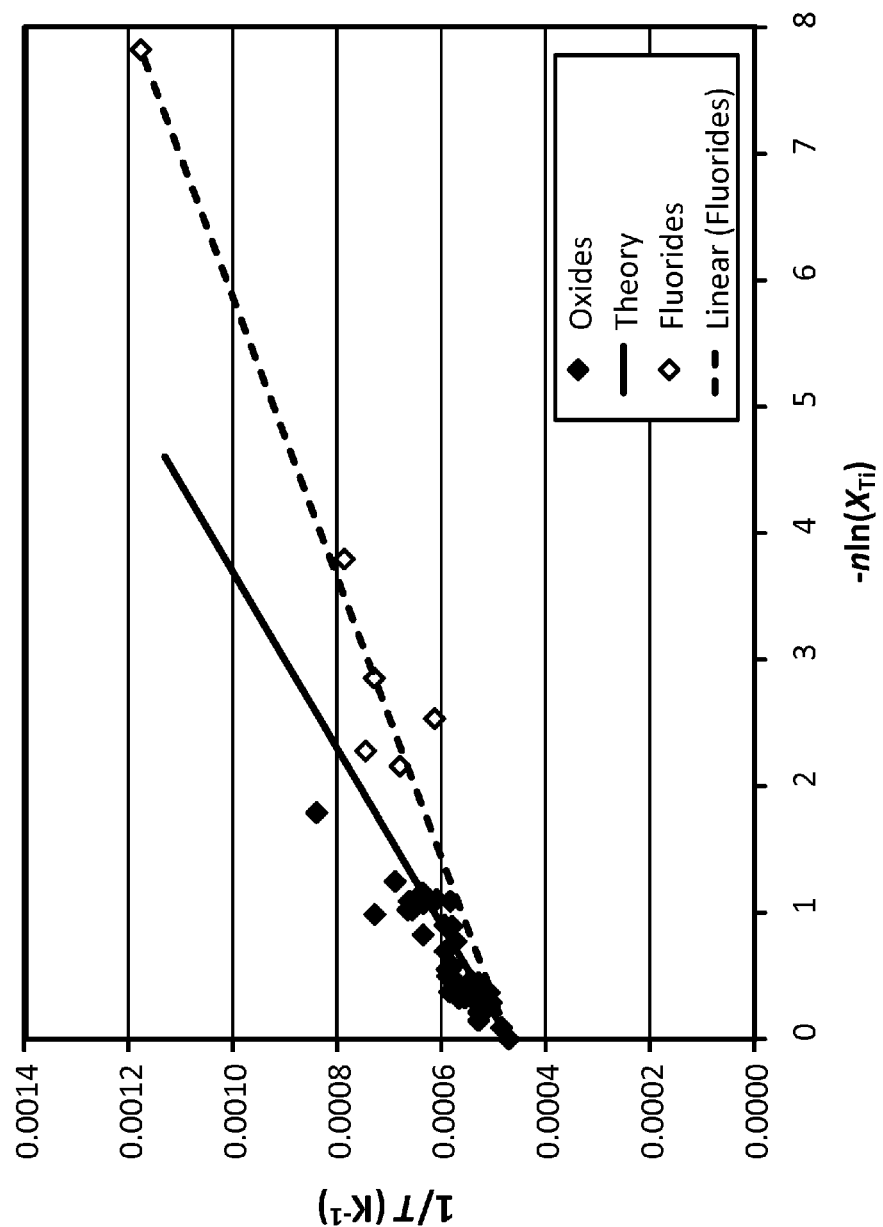
FIG. 12: Eutectic data for $TiO_2$-D phase diagrams compared to cryoscopic theory for an ideal solution.

FIG. 12 fits eutectic data for $TiO_2$-D melts $1/T$ versus $\ln(X_C)/n$ to Equation (2) where n is taken to be the expected number of unique particles for the given solvent D. There is considerable scatter to the data as is expected since n in real solutions will deviate from theory as components interact with each other favorably or unfavorably. However the bulk of the data for D=oxides are reasonably close to the theoretical curve for an ideal solution. Unexpectedly the data for D=fluorides systematically fits to a lower melting curve than for the oxides with $n_{fluoride}/n_{oxide} \approx 0.63$.

Figure 13:
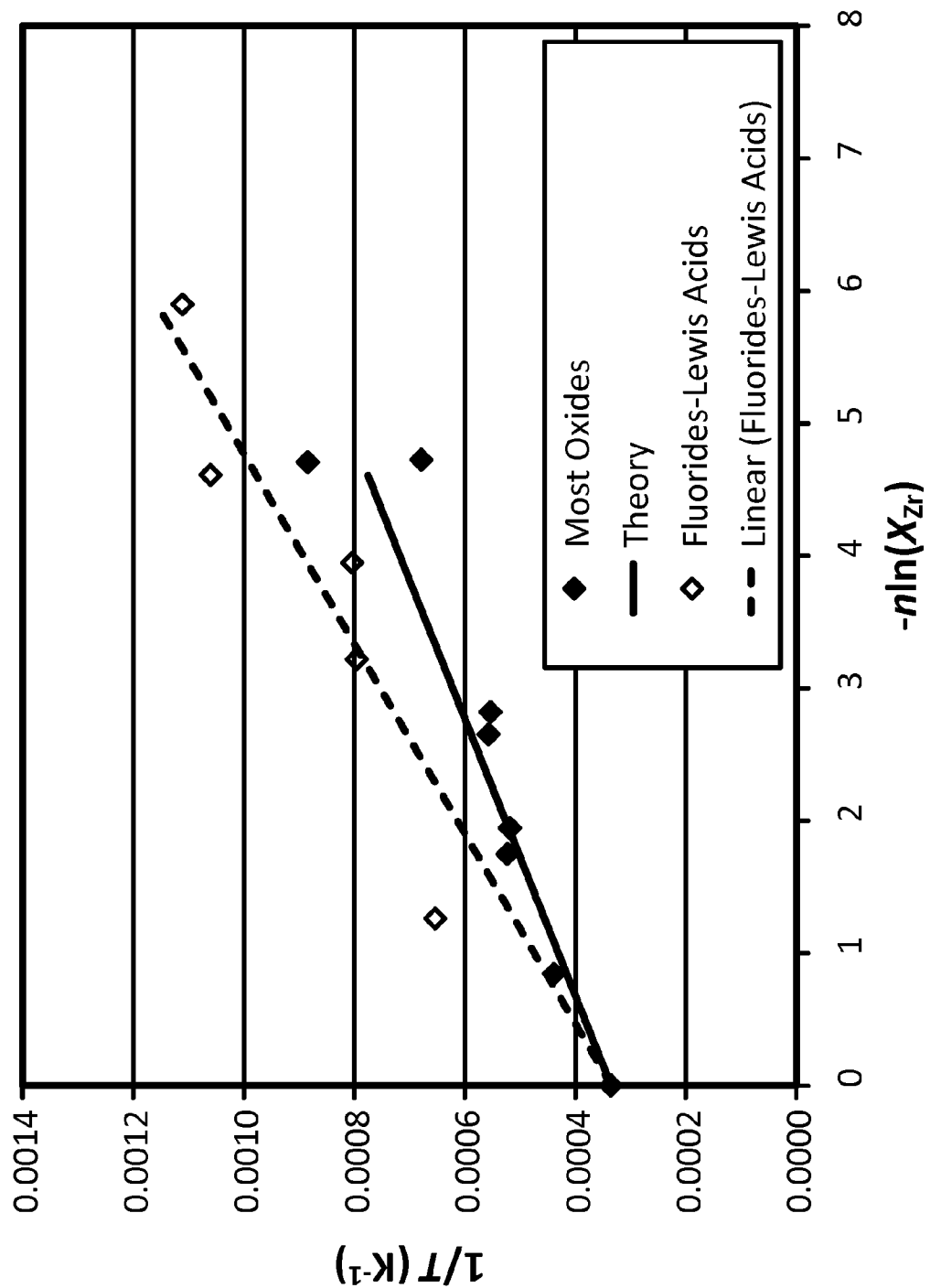
FIG. 13: Eutectic data for $ZrO_2$-D phase diagrams compared to cryoscopic theory for an ideal solution.

FIG. 13 fits similar data for $ZrO_2$-D melts. There are fewer points available for zirconia. Most of the oxide data fits the theory. However in this case for both the fluoride data and the data for strong Lewis acids such as $V_2O_5$ and $WO_3$, the n deviates in the opposite direction with $n_{fluoride-Lewis\ acid}/n_{oxide} \approx 1.45$. This corresponds to increased association of the solvent and a higher solubility of $ZrO_2$, probably because these solutes associate in the melt to create complexes such as the low melting point $ZrF_4$. A Lewis acid deviation was not seen in either direction for $TiO_2$. With such a small amount of data of uncertain accuracy, these numbers are not quantitative, but show qualitative trends.

$ZrO_2$ has been grown from $PbF_2$, $Na_2B_4O_7$ and a $Na_2B_4O_7$—NaF mixture with a relatively low rate of solvent evaporation through sealing the crucible. Some have found a variety of solubilities for $ZrO_2$ in various solvents near 1000° C.; 11.5 mole % in NaF78%-$Na_2B_4O_7$22%, 15.6 mole % in KF78%-$B_2O_3$22%, 20 mole % in KF62.5%-$V_2O_5$37.5% and 7 mole % in $PbF_2$. Most of these fit well to the current model, but the latter datum for $PbF_2$ is not consistent with FIG. 13. $PbF_2$ and KF78%-$B_2O_3$22% had excessive volatilization, which may be the cause of the problem. Lewis acids such as $V_2O_5$ are conventionally known to increase solubility.

Figure 14:
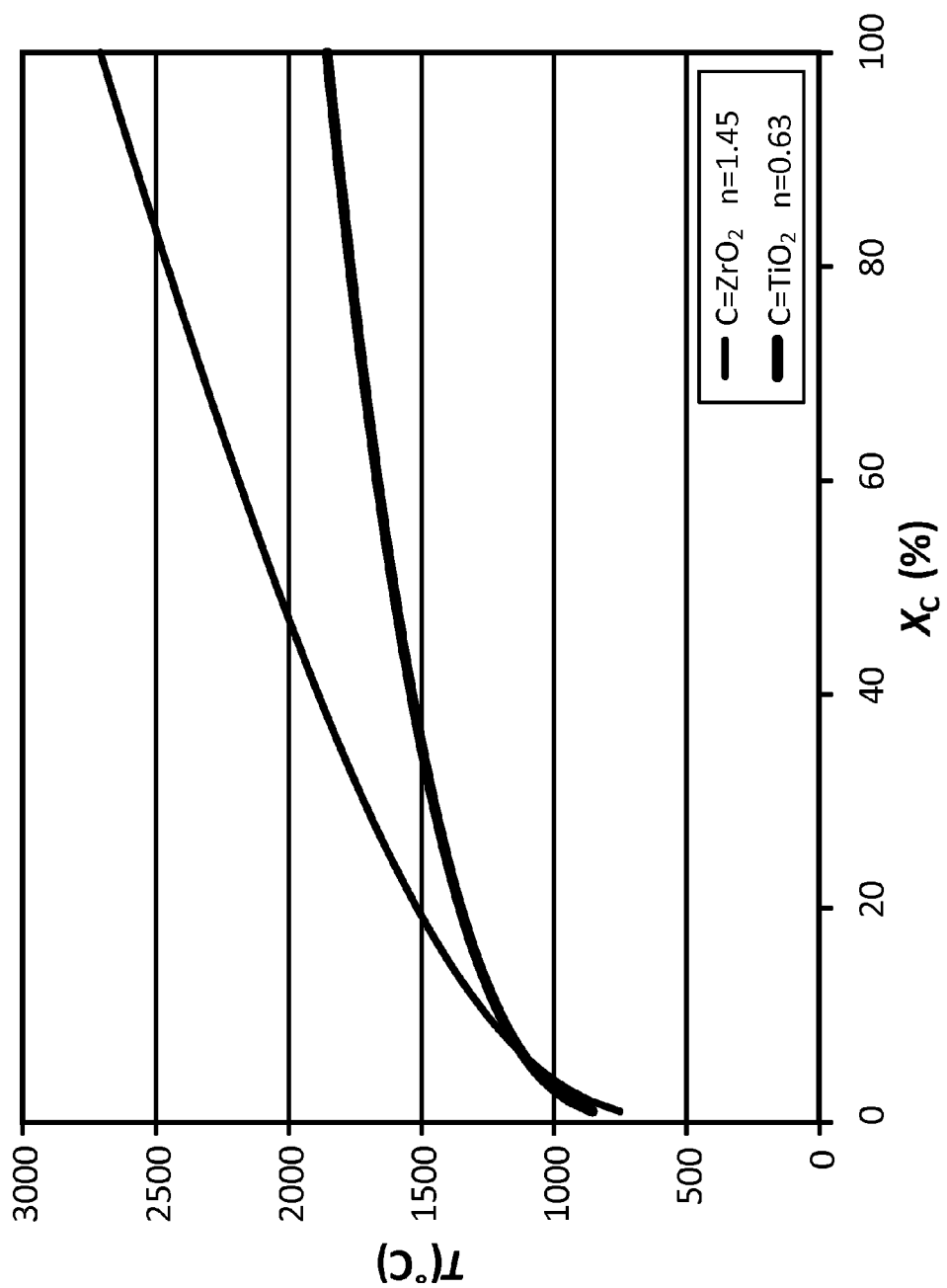
FIG. 14: Calculated liquidus curves of C=$ZrO_2$ and $TiO_2$ in an arbitrary single particle solvent D according to Equation (3) for n($ZrO_2$)=1.45 and n($TiO_2$)=0.63.
Figure 15:
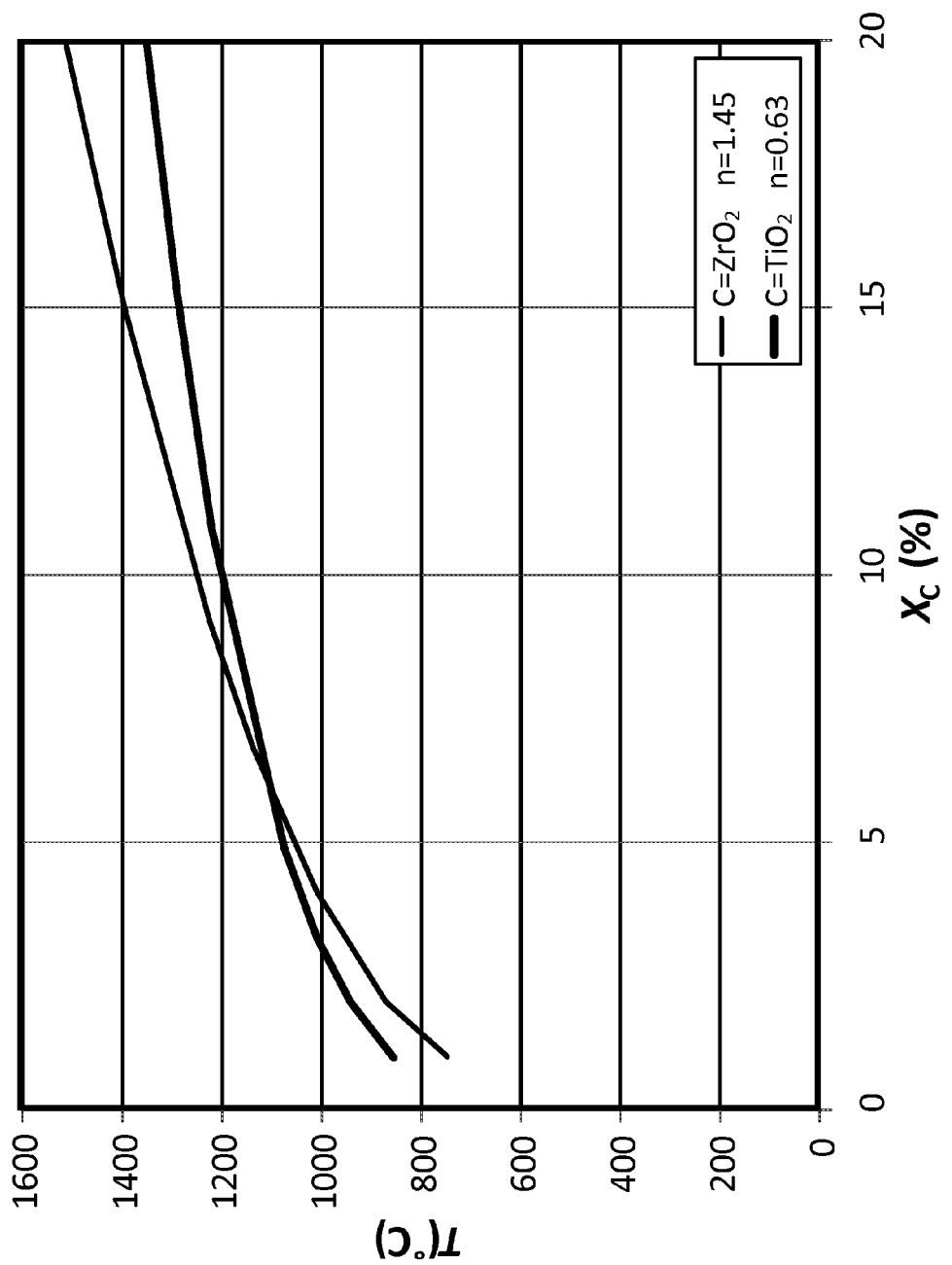
FIG. 15: Detail view of the low concentration region of the plot in FIG. 14.

FIG. 14 depicts Equation (3) for $n(ZrO_2)=1.45$ and $n(TiO_2)=0.63$. This results in the two liquidus curves crossing. Similar crossing curves occur for the cases of two- and three-particle solvents, $n(ZrO_2)=2\times1.45$, $n(TiO_2)=2\times0.63$ and $n(ZrO_2)=3\times1.45$, $n(TiO_2)=3\times0.63$. These relations will result in an equimolar concentration greater than the crossing concentration having a zirconia-rich phase crystallize first as in the previous case and an equimolar concentration less than the crossing concentration having a phase rich in titania ($TiO_2$—titanium oxide) crystallize first as the melt is cooled. If the melt composition is just above the crossing concentration, the first phase to crystallize will be zirconia-rich until the melt is sufficiently depleted to enter the titania-rich region, resulting in two phases after cooling. FIG. 15 displays the low concentration region of FIG. 14 in greater detail. This new model allows the explanation of the previous results. The apparent immiscibility of the two solid phases is, in fact, not a result of solid thermodynamics, but of solution thermodynamics.

The special case $K_{Zr}=1$ with $X_{Zr}=X_{Ti}$ occurs only at a very specific crossing composition as depicted in FIGS. 14 and 15 at the growth temperature given by the crossing of the curves.

The uncertain quality of the data used to derive FIGS. 14 and 15 and the fact that they are for $ZrO_2$—$TiO_2$ rather than for PZ-PT means that these figures are not sufficient to predict the best growth conditions, but they give a formalism to determine such conditions for any given solvent.

A preferred solvent will comprise a fluoride compound of low melting temperature such as $PbF_2$ ($T_M=830°$ C.), the alkali halides LiF ($T_M=848°$ C.), NaF ($T_M=956°$ C.) or KF ($T_M$=858° C.), or some mixture thereof since such compounds affect both n(TiO$_2$) and n(ZrO$_2$).

A less preferred, but also possible solvent will comprise a strong Lewis acid such as MoO$_3$, WO$_3$, V$_2$O$_5$ or P$_2$O$_5$. Equimolar salt compounds such as Li$_2$MoO$_3$ are not Lewis acids, but rather mild Lewis bases. However, higher order Lewis acid salts such as Li$_2$Mo$_2$O$_7$ can be acidic when they dissociate in solution. Likewise, lead compounds such as PbMoO$_3$ and Pb$_3$(PO$_4$)$_2$ are Lewis acids since they dissolve into the Lewis neutral PbO and the Lewis acids MoO$_3$ and P$_2$O$_5$.

All these compounds have significant vapor pressures at high temperatures. The strong Lewis base oxides MoO$_3$, WO$_3$, V$_2$O$_5$ or P$_2$O$_5$ have a much higher vapor pressure by themselves than in compound form, but they are much more effective as solvents in their individual oxide form as, for example, Li$_2$MoO$_4$ has a poor solubility for zirconia. Rearrangement of ions in the melt may result in formation of compounds with higher or lower vapor pressures.

PbO as a melt constituent also has a significant vapor pressure at high temperature. It has been shown that PZ cannot precipitate from a pure PbF$_2$—ZrO$_2$ melt, but that PbO must be present. It is therefore clear that evaporation of PbO so that its concentration is below that of the combined concentrations of ZrO$_2$ and TiO$_2$ will be detrimental to the crystallization of PZT. An excess of PbO must therefore be added to the solvent to assure this does not occur. It has been found that PZ grew better if PbO was added; a PbO64%-PbF$_2$36% solvent was used to grow PZ. Growth improves if 6% B$_2$O$_3$ is used as a melt additive to reduce solvent evaporation.

Additional Substrate Considerations for LPE

Successful liquid phase epitaxy requires selection of a substrate with a good structural, chemical, lattice parameter and thermal expansion match to the desired PZT composition. This is preferably a cubic, rhombohedral or tetragonal perovskite within 2% or 0.08 Å of the lattice parameter of PZT to prevent the formation of misfit dislocations.

A c-oriented PZT film is therefore expected to require a substrate lattice parameter near the average of a and b in this range, which is 4.055 Å or 8.11 Å if ordering occurs such that the unit cell lattice parameters are doubled. Those knowledgeable in the art will understand that PZT and possibly the substrate may have cubic crystal structures at the growth temperature and a non-destructive phase transition between the growth temperature and room temperature. The phase transition resulting in non-degeneracy of the crystal directions and non-destructive domain twinning will proceed on cooling according to the cooling program, the anisotropic stress field of a disc and the stress between the film and the substrate. The latter will evolve to minimize the stress energy and give the best possible match. Following growth, poling in an electric field may be used to improve or impose a specific match.

The facet directions of the perovskites are the (001), (010) and (100) directions of the primitive perovskite unit cell. These are the slowest growing directions and growth typically occurs by growth at steps and dislocations, which creates an as-grown surface with bunched macro-steps, growth hillocks and possible impurity segregation at the steps and dislocations. This is undesirable for LPE where a fast-growing direction perpendicular to the substrate and a smooth uniform growth surface is desired. This best occurs for an atomically rough non-facet growth direction where almost all surface sites are growth sites.

Non-facet surfaces can be achieved by growing on substrates cut at an intentional misorientation from a crystallographically oriented facet, typically 0.5-2.0° off the facet, for example the (001) direction. This can be desirable if the crystallographic properties of the facet direction are desired in the final crystal. Alternatively growth can be performed on a crystallographic orientation that is not a facet, for example (111) as is used in LPE of garnets. This makes characterization of the resultant films by x-ray diffraction more practical than mis-oriented substrates.

If there is an asymmetry of lattice parameters in the growth plane, this can be used to orient the orthorhombic PZT crystals in the plane of growth by aligning the smaller substrate lattice parameter to a(PZT)=4.03 Å and the larger substrate lattice parameter to b(PZT)=4.08 Å.

Most importantly the substrates must be growable to a large size. Potential substrates include existing substrate materials, innovative use of an existing material and compounds that have not been made in crystal form previously.

Existing Substrate Materials

Certain known substrate materials could possibly be used to grow PZT by LPE. Strontium titanate has been most commonly used for vapor phase epitaxy (VPE) of piezoelectric perovskite thin films, often with one or more buffer/lattice matching layers. However it has a high lattice mismatch (3-6.5%) to PZT and PMN-PT that is tolerated by VPE thin films, but not by LPE thick films. This material is also hard to grow and is not considered desirable as a substrate material for LPE of PZT.

Neodymium scandate (average lattice parameter 4.014 Å, average a-b mismatch 1%) is commercially available and praseodymium scandate (average lattice parameter 4.027 Å, average a-b mismatch 0.7%) can be produced and is available in experimental quantities. These lattice matches may be viable, but these materials are expensive, hard to grow and of limited availability. This material has low to moderate promise as a substrate material based on its good lattice match and existing supply.

Lead Magnesium Niobate-Lead Titanate (PMN-PT) and Lead Indium Niobate-Lead Magnesium Niobate-Lead Titanate (PIN-PMN-PT)

It will be noted from FIG. 8 that PMN-PT is currently classified in the prior art as an epitaxial material based on desirable epitaxial growth of films of the MPB composition. It has not been known as a substrate material. Bulk PMN-PT and ternary solid solutions containing lead indium niobate (e.g., PIN-PMN-PT) have been successfully grown up to 3" in diameter by the Bridgman method. However the non-unity segregation coefficient $K_{PT}$≈0.85 results in a gradient in the composition resulting from selective depletion of the more refractory phase. Therefore commercial crystal growth of PMN-PT is initiated from a melt of composition that will produce the desired phase in the main body of the crystal, but in fact the two ends are of different crystal structures with the PMN-rich bottom (first crystallized) being rhombohedral, the middle being MPB with monoclinic structure coexisting with rhombohedral or tetragonal and the PT-rich top (last crystallized) being tetragonal. Only the central MPB region is used in device applications and the rhombohedral bottoms and tetragonal tops are cut off as scrap.

The use of these materials is most desirable as a substrate for LPE of PZT for the following reasons:
PMN-PT has a perfect structural match to PZT.
PMN-PT and PIN-PMN-PT have the closest lattice parameter matches to PZT of the bulk growable perovskites.
PMN-PT and PIN-PMN-PT have the common constituents of lead oxide and titanium oxide with PZT.

Therefore PMN-PT and PIN-PMN-PT are less likely to contaminate the melt even if some quantity is dissolved.

PMN-PT and PIN-PMN-PT are most likely to have the correct coefficient of thermal expansion matching that of PZT.

PMN-PT and PIN-PMN-PT are already industrially produced in large size.

The proposed substrate material is a scrap by-product of this process.

Lead Magnesium Niobate (PMN) and Lead Indium Niobate (PIN)

Bulk relaxor ferroelectrics PMN and PIN are not solid solutions but instead stoichiometric compounds with a rhombohedral structure at room temperature. As such they have been grown by the Bridgman and top seeded solution growth methods. It will be understood that these compounds are a special case end member of the solid solutions with the PT concentration equal zero. Because these compounds lack the strong piezoelectric properties of the solid solutions, they have not been commercialized. These materials are not known as substrate materials.

The use of these materials is most desirable as a substrate for LPE of PZT for the following reasons:

PMN and PIN have a perfect structural match to PZT.

PMN and PIN have the closest lattice parameter matches to PZT of the bulk growable perovskites.

PMN and PIN have the common constituent of lead oxide with PZT.

Therefore PMN and PIN are less likely to contaminate the melt even if some quantity is dissolved.

PMN and PIN are most likely to have the correct coefficient of thermal expansion matching that of PZT.

PMN and PIN can be grown in bulk by the Bridgman process with no compositional gradient such as occurs in the solid solutions.

$AE(AM_{1/4}Nb_{3/4})O_3$ and $AE(AM_{1/4}Ta_{3/4})O_3$

This class of compounds (Table V) was reported in powder form with alkaline earths (AE) on the perovskite A site, alkali metals (AM) on the ¼ of the B site and niobium or tantalum on ¾ of the B site, nominally disordered. The compounds were reported with cubic crystal structures, which has since been found not to be the case. $Sr(Li_{1/4}Ta_{3/4})O_3$ was grown previously as discussed in Prior Art Example #4, but that compound proved to have a destructive phase transition on reheating. $Ba(Li_{1/4}Ta_{3/4})O_3$ is reported here for the first time as tetragonal with doubled lattice parameters representing increased ordering.

TABLE V

Existing and prospective $AE(AM_{1/4}Nb_{3/4})O_3$ and $AE(AM_{1/4}Ta_{3/4})O_3$ compounds.

| Compound | a(Å) | b(Å) | c(Å) | T | √2b(Å) | Reference |
|---|---|---|---|---|---|---|
| $Sr(Na_{1/4}Ta_{3/4})O_3$ | 5.98 | 5.69 | 8.10 | 0.941 | 8.047 | This application |
| $Sr(Na_{1/4}Nb_{3/4})O_3$ | 6.00 | 5.68 | 8.12 | 0.941 | 8.039 | This application |
| $Ba(Na_{1/4}Ta_{3/4})O_3$ | 4.137 | | | 0.997 | | [14], [15] |
| $Sr(Li_{1/4}Ta_{3/4})O_3$ | ~4.00 | | | 0.970 | | [16] |
| $Ba(Li_{1/4}Ta_{3/4})O_3$ | 8.28 | | 8.02 | 1.028 | | This application |

[14] F. Galasso, *Perovskites and High $T_C$ Superconductors*, Gordon and Breach, New York, 1990.
[15] F. Galasso and J. Pinto, "Preparation of $Ba(Na_{0.25}Ta_{0.75})O_3$ and $Sr(Na_{0.25}Ta_{0.75})O_3$ with the perovskite structure," *Inorg. Chem.* 4: 255 (1965).
[16] V. J. Fratello, et al., "A New Perovskite Substrate Material, Strontium Lithium Tantalate", invited talk presented at the 14th International Conference on Crystal Growth, Grenoble, France, Aug. 9-13, 2004.

$Sr(Na_{1/4}Ta_{3/4})O_3$ and $Sr(Na_{1/4}Ta_{3/4})O_3$ are reported here with the correct orthorhombic structure for the first time with unit cells rotated by 450 in the a-b plane as is common in the perovskites, so the a-b lattice parameters are a factor of √2 different and c is doubled, but these have an attractive b-c plane average lattice parameter equivalent to ~8.075 Å that are approximate doubles of the PZT a-b average with a mismatch of only ~0.04%. These compounds are likely congruently melting based on experience with $Sr(Li_{1/4}Ta_{3/4})O_3$ and growable by the Czochralski method. These compounds have an excellent room temperature lattice match to PZT, but may have a somewhat different coefficient of thermal expansion. They also could contaminate the melt if broken and dissolved in the melt. The viability of bulk crystal growth has not been determined though it is deemed likely and the constituents are inexpensive. These materials have only moderate promise as substrate materials.

$Ba(TM^{3+}_{1/2}M^{5+}_{1/2})O_3$ and $Ba(TM^{2+}_{1/3}M^{5+}_{2/3})O_3$ with M=Nb and Ta These classes of compounds are known with trivalent ($TM^{3+}$:Nb—Ta=1:1 Table VI) and divalent ($TM^{2+}$:Nb—Ta=1:2 Table VII) transition metals on the B site. These compounds variously crystallize in hexagonal, ammonium iron fluoride and cubic/tetragonal perovskite structures. The 1:2 B-site stoichiometry is more prone to hexagonal symmetry as might be predicted numerically.

TABLE VI $Ba[TM^{3+}_{1/2}Nb_{1/2}]O_3$ and $Ba[TM^{3+}_{1/2}Ta_{1/2}]O_3$ reported compounds.

| Compound | a(Å) | T | Reference |
|---|---|---|---|
| $Ba(Cr_{1/2}Nb_{1/2})O_3$ | Hexagonal | 1.050 | [17] |
| $Ba(Mn_{1/2}Nb_{1/2})O_3$ | 4.083 | 1.043 | [14] |
| $Ba(Mn_{1/2}Ta_{1/2})O_3$ | 4.076 | 1.043 | [14] |
| $Ba(Fe_{1/2}Nb_{1/2})O_3$ | 4.06 | 1.042 | [14] and this application |
| $Ba(Fe_{1/2}Ta_{1/2})O_3$ | 4.056 | 1.043 | [14] |
| $Ba(Co_{1/2}Nb_{1/2})O_3$ | 4.06 $(NH_4)_3FeF_6$ | 1.047 | [14] |
| $Ba(Ni_{1/2}Nb_{1/2})O_3$ | ~4.1 (probably lower) | 1.054 | [14] |
| $Ba(Ni_{1/2}Ta_{1/2})O_3$ | Est. 4.05 | 1.054 | Not reported |

[14] F. Galasso, *Perovskites and High TC Superconductors*, Gordon and Breach, New York, 1990.
[17] JCPDS Powder Diffraction Files.

TABLE VII $Ba(TM^{2+}_{1/3}Nb_{2/3})O_3$ and $Ba(TM^{2+}_{1/3}Ta_{2/3})O_3$ reported compounds.

| Compound | a(Å) | T | Reference |
|---|---|---|---|
| $Ba(Mn_{1/3}Nb_{2/3})O_3$ | Not reported | | [14] |
| $Ba(Mn_{1/3}Ta_{2/3})O_3$ | Hexagonal | | [14] |
| $Ba(Fe_{1/3}Nb_{2/3})O_3$ | 4.085 | | [14] |
| $Ba(Fe_{1/3}Ta_{2/3})O_3$ | 4.10 | | [14] |
| $Ba(Co_{1/3}Nb_{2/3})O_3$ | 4.09 | | [14] |
| $Ba(Co_{1/3}Ta_{2/3})O_3$ | Hexagonal | | [14] |
| $Ba(Ni_{1/3}Nb_{2/3})O_3$ | 4.074 | | [14] |
| $Ba(Ni_{1/3}Ta_{2/3})O_3$ | Hexagonal | | [14] |
| $Ba(Cu_{1/3}Nb_{2/3})O_3$ | 8.04/8.40 | | [14] |
| $Ba(Zn_{1/3}Nb_{2/3})O_3$ | 4.094 | | [14] |
| $Ba(Zn_{1/3}Nb_{2/3})O_3$ | Hexagonal | | [14] |

[14] F. Galasso, *Perovskites and High TC Superconductors*, Gordon and Breach, New York, 1990.

The transition metals Mn, Fe, Co, Ni and Cu are capable of multiple valence states depending on the oxygen partial pressure and temperature, which complicates the phase diagram. Fe (and Mn) notably occur in both the 2+ and 3+valence states. In the spinel structure $Fe_3O_4$ there is a combination of the two, but that compound actually has two different symmetry sites so it is really $Fe^{3+}_2Fe^{2+}O_3$. This is not the case for the perovskites, but preliminary experiments show it is possible for there to be a continuous solid solution between the 2+ and 3+perovskites for both Fe and Mn as the transition metal, e.g., $Ba(Fe^{2+}_xFe^{3+}_{(1-3x)/2}Nb_{(1+x)/2})O_3$. As part of this study $Ba(TM^{2+}_{1/7}TM^{3+}_{2/7}Nb_{4/7})O_3$ compounds with TM=Fe and Mn were made by powder methods and shown to be single phase solid solutions. The equilibrium valence state of Fe and Mn varies with atmosphere and temperature. It is expected that $Fe^{2+}$ will be the stable valence state at the melting temperature under low oxygen atmosphere, for example 97% $N_2$-3% $O_2$ as is typically used for high temperature crystal growth from iridium crucibles. $Fe^{3+}$ may be the stable valence state in a pure $O_2$ atmosphere as may be used in crucible-less float zone growth, but this has not yet been determined. These compounds are more likely to be stable against valence changes, reduction and evaporation at lower temperatures. The Nb compounds will have lower melting temperatures than the Ta compounds. They have a cubic crystal structure and are therefore not subject to a phase change. The lattice parameter of $Ba(Fe_{1/2}Ta_{1/2})O_3$ is identical to the average a-b lattice parameter of PZT for an excellent lattice match.

Melting these compounds or determination of their phase diagrams has not been recorded in the literature. Perovskites containing $Ni^{2+}$ were investigated previously and $Ca(Ni^{2+}_{1/3}Nb_{2/3})O_3$ melted congruently ~1650° C., while $Sr(Ni_{1/2}Nb_{1/2})O_3$ melted incongruently ~1875° C. Achieving $Ni^{3+}$ or $Fe^{3+}$ under typical low oxygen conditions may be problematic. $Cr^{3+}$ is likely, but the recorded compound is hexagonal. Ba compounds are expected to have higher melting temperatures than previous Ca and Sr work and be more prone to reduced Nb and Ta as a result. Because of the high vapor pressure of iron oxide especially in low oxygen partial pressure, preliminary studies of these materials have been undertaken by float zone crystal growth and full scale production by Bridgman would most likely be required.

These compounds have an excellent room temperature lattice match to PZT and a stable cubic structure, but may have a somewhat different coefficient of thermal expansion. They also could contaminate the melt if broken and dissolved in the melt. The viability of bulk crystal growth has not been determined and is expected to require considerable development. These materials therefore have only low promise as substrate materials.

PZT Growth Conditions

The growth conditions for the preferred PZT composition $Pb(Zr_{0.52}Ti_{0.48})O_3$ determined hereby are as follows:

The choice of $X_{Zr}$ and $X_{Ti}$ melt concentrations such that there is a growth temperature where the combination of their two concentrations and undercoolings yields the desired crystal concentration x, where x=0.52 at the MPB.

It is preferred to add either PZT or a combination of PZ and PT, because it has been determined these materials dissolve more readily than $ZrO_2$ and $TiO_2$. These materials may be pre-reacted or obtained commercially.

Holding the growth conditions near constant so the equilibrium x will not change significantly during growth.
  Holding the growth temperature nearly constant is necessary to hold the distribution coefficient constant.
  Growth at a temperature of 700-900° C.
  Obviously the melt concentrations of PbO, $ZrO_2$ and $TiO_2$ will change as the crystal grows and the melt is depleted. The amount crystallized of each of these constituents must therefore be a small enough fraction of the total quantity in the melt so as to result in only a small change in the saturation temperatures. This can be accomplished with a large deep melt.
  Slight changes in the saturation temperatures may be compensated by a small ramp in the growth temperature to maintain a constant undercooling. The total ramp should not exceed 25° C. so as not to change the distribution coefficient.
The selective evaporation of any constituent will change the melt composition systematically throughout growth. While a sealed system can avoid this, it presents other technological challenges. Instead it is preferred to hold the growth temperature below 900° C. to lower evaporation below a significant amount. $B_2O_3$ can also be added to reduce evaporation and $V_2O_5$ may work similarly. Baffling the furnace damps the gas dynamics so less of the evaporated material goes out the exhaust system needed to control Pb-containing vapors.
The technology of LPE uniquely supplies these conditions in an optimal embodiment.
It is most desirable that the melt composition be such that $X_{Zr}=X_{Ti}$ and $K_{Zr}\approx 1$ so that there is no selective depletion of the melt that changes the melt composition. This is optimized by.
  Choosing a solvent that comprises a higher solubility for $ZrO_2$ than the ideal solution approximation. Alternatively this may be described by a higher melting point depression of $ZrO_2$ or a higher Van 't Hoff factor. Solvents that do this specifically include $PbF_2$, LiF, NaF, KF, $Na_3AlF_6$, PbO, $Pb_3(PO_4)_2$, $PbCl_2$, $B_2O_3$, $WO_3$, $MoO_3$, $V_2O_5$, $P_2O_5$, $PbWO_4$, $PbMoO_4$, $Li_2B_4O_7$, $Na_2B_4O_7$, $K_2B_4O_7$, $Pb_2V_2O_7$.
    Fluoride compounds and potentially other halide compounds
      Lead fluoride $PbF_2$ has the least risk of impurity in the crystal
      Alkali fluorides LiF, NaF and KF are well known solvents; Li is least likely to be incorporated in the crystal because of its ionic size and valence combination
      Cryolite $Na_3AlF_6$ is also a well-known solvent
      Other halides, specifically $PbCl_2$ may also work similarly
    Strong Lewis acids
      $MoO_3$, $WO_3$, $V_2O_5$, $P_2O_5$ are notable examples.
      Lead compounds with these Lewis acids are also Lewis acids e.g., $PbMoO_4$, $PbWO_4$, $Pb_2V_2O_7$ and $Pb_3(PO_4)_2$
  Choosing a solvent that comprises a lower solubility for $TiO_2$ than the ideal solution approximation. Alternatively this may be described by a lower melting point depression of $TiO_2$ or a lower Van 't Hoff factor. Solvents that do this specifically include the fluorides discussed above.
  Choosing melt concentrations for these constituents at or near the crossing point, which must be determined in advance.
  Choosing a growth temperature at or near the crossing point, which must be determined in advance.
For stable PZT growth there should be at least an equal concentration of PbO $X_{Pb} \geq X_{Zr}+X_{Ti}$.
Preferred melt composition embodiments include the following with the compositions in molar percent.
  1. $PbF_2$—KF—$Pb_3(PO_4)_2$ solvent
  a. $PbF_2$—58 mole %
  b. KF—27 mole % c. $Pb_3(PO_4)_2$—5 mole %
d. $PbZrO_3$—5 mole %
e. $PbTiO_3$—5 mole %
2. $PbF_2$—PbO—$B_2O_3$ solvent
 a. $PbF_2$—80 mole %
 b. PbO—5 mole %
 c. $B_2O_3$—5 mole %
 d. $PbZrO_3$—5 mole %
 e. $PbTiO_3$—5 mole %
3. LiF—PbO—$V_2O_5$ solvent
 a. LiF—65 mole %
 b. PbO—20 mole %
 c. $V_2O_5$—5 mole %
 d. $PbZr_{0.52}Ti_{0.48}O_3$—10 mole %

These solvents are all soluble in a mixture of 50% nitric acid, 5% acetic acid and 45% water. They have reasonable solubility for the solute with approximately equal solubilities of zirconia and titania, and the solvent components are unlikely to be incorporated as impurities.

The following substrate materials are preferred embodiments and have good structure and lattice match suitable for growth of PZT:

PMN-PT in either the rhombohedral or tetragonal phase is the preferred embodiment.

PIN-PMN-PT in either the rhombohedral or tetragonal phase

Rhombohedral PIN or PMN

The existing rare earth scandates $NdScO_3$ and $PrScO_3$, which have not been used for liquid phase epitaxy.

The compounds $Sr(Na_{1/4}Ta_{3/4})O_3$ and $Sr(Na_{1/4}Nb_{3/4})O_3$, which have not been accurately characterized or grown previously.

$Ba(TM^{2+}_x TM^{3+}_{(1-3x)/2} B'_{(1+x)/2})O_3$ with TM=Fe, Ni and Mn, B=Nb and Ta and x=0–⅓.

In one embodiment, the solution comprises $ZrO_2$ or $PbZrO_3$ and wherein the solubility of $ZrO_2$ or PZ is higher than predicted by ideal solution theory. In one embodiment, the solution comprises $TiO_2$ or $PbTiO_3$ and wherein the solubility of $TiO_2$ or PT is lower than predicted by ideal solution theory. In one embodiment, the solubilities of PT and PZ in the melt are approximately equal. In one embodiment, the solubilities of titanium oxide and zirconium oxide in the melt are approximately equal.

Previous work has shown that growth from a system where PZ or PT is strongly preferred thermodynamically results in crystals significantly removed from the desired nearly equimolar composition. Therefore solvent, PZT concentration and growth conditions wherein the solubilities of PZ and PT are nearly equal is most desirable for stable growth of the MPB composition of PZT so that a large crystal of constant composition may be formed. The use of a solvent component or components that increase the solubility of zirconium oxide/lead zirconate above what is seen with the bulk of phase diagrams with oxide materials and what is predicted by ideal solution theory is necessary to achieve this. Additionally use of a solvent component or components that decrease the solubility of titanium oxide/lead titanate below what is seen with the bulk of phase diagrams with oxide materials and what is predicted by ideal solution theory is extremely desirable further to improve the relative solubility of PZ and PT to be nearly equal.

Ionic dopants on the A and B sites that are donors or acceptors with respect to the bulk composition are commonly added to improve the piezoelectric properties of piezoelectric materials, most specifically the coercivity and mechanical quality factor Q. These can comprise, but are not limited to $La^{3+}$, $Bi^{3+}$, $Na^+$, $W^{6+}$ and Mn(mixed valence). In one embodiment, the PZT comprises less than 10 molar percent ionic dopants.

In one embodiment, the method further includes a step of removing the PZT single crystal from the substrate. In one embodiment, removing the PZT single crystal from the substrate comprises lapping and polishing. Either on the substrate or removed from the substrate, the PZT crystal can be incorporated into devices, etc. for any use known to those of skill in the art.

Prior Art Example #1

High Temperature Solution Growth

Previous researchers have formulated melts of a molar composition according the formula:

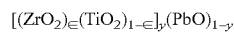

with ∈ values of approximately 0.1, 0.15, 0.2, 0.3, 0.4, 0.5, 0.54, 0.6 and 0.85. 50 g charges of these compositions, where the oxides were all at least 99.99% pure, were placed in platinum crucibles, which were sealed with crimped platinum lids. These were placed in alumina crucibles and put in a muffle furnace. The samples were heated to 1170° and crystal growth was done by the slow-cooling method at a rate of 3° C. per hour until the melt reached 950° C. At this temperature the crucible was inverted using an alumina rod inserted and attached to the alumina crucible to remove most of the remaining melt from the crystals that grew on the sides of the platinum crucible. After cooling to room temperature, the crystals were further cleaned with a mixture of 50% nitric acid and 50% water. This mixture well dissolves lead oxide, but also etched some of the lead oxide from the surface of the PZT crystals. The resultant crystals were only of 1 mm in size in their longest dimension.

It was determined that crystals of $Pb(Zr_xTi_{1-x})O_3$ could be grown with good quality only with 0.84≤x≤1 and 0≤x≤0.25 and that no crystals at all could be grown with 0.25<x<0.68, including the technologically important value of 0.52.

Prior Art Example #2

High Temperature Solution Growth

Previous researchers have grown PZT crystals of largest dimension of 1 mm from a solvent of PbO—KF—$PbF_2$ in molar ratios 1:1:2, 1:10:15, 1:14:40 with best results from 1:10:15. There was 42-50% solvent loss. The composition of the crystals was not measured.

Prior Art Example #3

High Temperature Solution Growth

Previous researchers used the following method of flux crystal growth.

PZT powder of composition $Pb(Zr_{0.525}Ti_{0.475})O_3$ was prepared by calcining constituents of >99% purity at 900° C. A solvent of PbO—KF—$PbCl_2$ in molar ratios of 2:1:2 was added in the amounts of 40% and 60%. The charge was placed in a 50 cubic centimeter volume platinum crucible, which was placed inside a vertical electric furnace. The samples were heated to 1150-1200° C. and held for 5-10 hours to dissolve the PZT. Then the crystals were grown by the slow-cooling method at a rate of 100 per hour to 950° C. and then cooled to room temperature. The crystals were separated from the flux by dissolving the flux in a warm mixture of 35% nitric acid and 65% water. Flux loss during growth was 22-32%.

Crystals of compositions of x=0.43, 0.50, 0.49 and 0.55 were identified with dimensions of 1×0.5×0.1 mm, but crystals of the target composition were not reproducibly obtained. Second phase crystals of $ZrO_2$ were observed for the lower solvent concentration 40% solvent melts.

Prior Art Example #4

Substrate Crystal Growth

A charge consisting of 205.43 grams of strontium carbonate $SrCO_3$, 12.85 grams of lithium carbonate $Li_2CO_3$ and 230.61 grams of tantalum oxide $Ta_2O_5$ was mixed in a ball mill and pressed into a solid body in an isostatic press. The charge was placed in an iridium crucible of dimensions 50 mm diameter by 50 mm high and put into an RF heated furnace. The melting point of this composition was 1915° C. A crystal of $SrLi_{0.25}Ta_{0.75}O_3$ was grown from this melt by the Czochralski method with a pulling rate of 1 mm/hour using a (100) oriented seed of the same material that had been produced in a previous growth run on an iridium wire seed. The crystal had a measured lattice parameter of 4.01 Å. The resultant boule was oriented to the (100) direction, ground to a cylinder and cut crosswise into slices that were then polished to an epitaxial finish.

It was determined that this material has a destructive phase transition between room temperature and 900° C. that prevented it from being used successfully as a substrate material.

Example #5

High Temperature Solution Growth

Mix a charge consisting of 116.83 grams lead fluoride $PbF_2$, 12.98 grams potassium fluoride KF, 36.25 grams potassium phosphate $Pb_3(PO_4)_2$, 18.78 grams lead zirconate $PbZrO_3$ and 15.16 grams lead titanate $PbTiO_3$. Place the charge in a 100 ml volume platinum crucible, in turn placed inside a vertical resistance-heated tube furnace with an air atmosphere per FIG. 7. Heat the melt to 900° C. and stir 10-16 hours with a platinum paddle to dissolve all the constituents. Cool the melt to 850° C. and dip a platinum cold finger, cooled with a steady stream of room temperature air, into the melt. Cool at a rate of 5° C. per hour to 800° C. After growth is concluded, remove the cold finger and PZT crystal or polycrystal grown on it from the melt and cool the crystal slowly to room temperature. Any remaining solvent may be dissolved in a mixture of 50% nitric acid, 5% acetic acid and 45% water by volume.

Example #6

Liquid Phase Epitaxy

Mix a charge consisting of 116.83 grams lead fluoride $PbF_2$, 12.98 grams potassium fluoride KF, 36.25 grams potassium phosphate $Pb_3(PO_4)_2$, 18.78 grams lead zirconate $PbZrO_3$ and 15.16 grams lead titanate $PbTiO_3$. Place the charge in a 100 ml volume platinum crucible, in turn placed inside a vertical resistance-heated tube furnace with an air atmosphere per FIG. 7. Heat the melt to 900° C. and stir 10-16 hours with a platinum paddle to dissolve the PZT. Cool the melt to 825° C. and dip a horizontally oriented 25 mm diameter substrate of (111)-oriented PMN-PT into the melt. Agitate the substrate at 40 rpm, reversing every 1-5 rotations. This is a stable undercooled melt and so crystals may be grown at a constant temperature. After 10 hours growth, remove the substrate and PZT crystal grown on it from the melt and spin at 1000 rpm to remove residual melt. Cool the crystal slowly to room temperature. Any remaining solvent may be dissolved in a mixture of 50% nitric acid, 5% acetic acid and 45% water by volume. Remove the substrate from the crystal by back lapping and polish the crystal to the desired thickness.

Example #7

Substrate Crystal Growth

Pre-dry in air suitable quantities of sodium carbonate $Na_2CO_3$ at 150° C., strontium carbonate $SrCO_3$ at 600° C. and tantalum oxide $Ta_2O_5$ at 1000° C. Mix a charge consisting of 180.81 grams of strontium carbonate $SrCO_3$, 16.23 grams of sodium carbonate $Na_2CO_3$ and 202.96 grams of tantalum oxide $Ta_2O_5$ in a ball mill, press it into a solid body in an isostatic press and place it in an iridium crucible of dimensions 50 mm diameter by 50 mm high and put it into an RF heated furnace. A crystal of $BaLi_{0.25}Ta_{0.75}O_3$ can be grown from this melt by the Czochralski method with a pulling rate of 1 mm/hour using a (100) oriented seed of the same material produced in a previous growth run on an iridium wire seed. Orient the resultant boule to the (100) direction using x-ray diffraction methods, grind to a cylinder and cut crosswise into slices that are polished to an epitaxial finish. These substrates can be used for liquid phase epitaxial growth of perovskites (e.g., PZT) of lattice parameter match within ±1.

Non-PZT Perovskite Crystal Growth

In another aspect, a method of growing an epitaxial perovskite single crystal is provided, comprising providing a substrate in a solution, wherein the substrate comprises a composition selected from the group consisting of a relaxor composition and a ferroelectric composition.

While PZT crystal growth is the primary focus of this disclosure, it will be appreciated by those of skill in the art that a methodology has been disclosed that may be applied to the growth of non-PZT perovskite crystals that are not congruently melting. As the class of perovskites is rich in compounds that are ferroelectric, piezoelectric, magnetic, electrooptic, multiferroic and have other important properties, this covers thin and thick films of individual compounds and multilayers of different compounds. In particular, the inventions of equalizing the relative solubility of refractory and non-refractory or less refractory components by flux selection and the use of new substrates in the gap between existing substrates are widely applicable.

Devices Incorporating PZT Crystals

In another aspect, a piezoelectric device is provided, comprising a PZT single crystal formed according to the disclosed methods. Such piezoelectric devices include a transducer, a receiver, a sensor, and an actuator.

A specific system is provided for characterizing pipelines through in-line inspection comprising a PZT piezoelectric device that is a transducer and/or a receiver. In one embodiment, the pipeline is configured to transport a substance selected from the group consisting of a liquid and a gas.

Ultrasonic based in-line inspection (ILI) tools, sometimes called "smart pigs" are commercially available for use in liquid pipelines for both wall thickness measurement and crack detection. These tools can operate in tethered or free-flowing mode. They characterize the pipe wall by interrogating it with an ultrasonic signal that is coupled through the pipeline liquid and receiving the reflected signals from the inner and outer pipe walls.

However in gas pipelines impedance matching of acoustic signals to gas or air at both the transducer-gas and gas-pipe interfaces is poor with a 150,000:1 difference between the impedances of steel and gas. Without a liquid couplant, it is difficult to impossible to receive a measurable signal from the back wall of the pipe or a crack tip in the pipe with current technology. The industry need to measure wall thickness accurately and eventually to detect cracks in gas pipelines is well known.

For several decades the material of choice for a wide variety of transducer applications has been lead zirconate titanate (PZT) polycrystalline ceramic of composition near the morphotropic phase boundary. "Hard" PZT ceramics are doped and fabricated to have a high Q to maximize the output efficiency. However ceramics are inherently non-uniform in crystallographic orientation resulting in significantly reduced coupling factors $k_{33}$.

First generation piezoelectric single crystals have been made from binary solid solution relaxor-PT ferroelectric compositions such as $(1-x)Pb(Mg_{1/3}Nb_{2/3})O_3$-$xPbTiO_3$ (PMN-PT or PMNT). These offer high performance with ultra-high electromechanical coupling factors $k_{33}$>0.9 and improved bandwidths. However these materials are limited in temperature and acoustic power by a much lower operating temperature range compared to PZT.

Crystals used in electromechanical devices, such as high power ultrasonic transducers or actuators, are subjected to high electric fields, which necessitate that the crystals possess low dielectric/mechanical losses and relatively high coercive fields. The dielectric losses of PMN-PT crystals are reported to be on the order of ≤0.4%, similar to the values observed in "hard" PZT based piezoelectrics, however, their mechanical quality factors Q are found to be less than 100, similar to "soft" PZT ceramics. The low mechanical Q's hence limit single crystals to low frequency actuators or resonant power transducers that operate at low duty cycles. Furthermore, the low coercive field ($E_C$) of crystals, being only 2-3 kV/cm, restricts their use to low ac voltage applications or devices requiring a "biased" drive level. In ceramics coercivity can be supplied by grain boundaries, but in defect-free single crystals, it must be an intrinsic property of the material.

Single crystal PZT systems with high operating temperatures, high piezoelectric coefficients, high electromechanical coupling factors, high Q's and improved coercivities are therefore a major step forward for transducer applications. Single crystal PZT has been realized to date only in limited and non-commercial sizes, quality and composition. PZT crystals would be uniquely well suited to small dimensional arrays promoting increased miniaturization. It has been demonstrated that miniaturizing array based transducers reduces artifacts, known as side-lobes, due to inherent aberrations in the acoustic field. This is proposed as an enabling technology for higher power array transducers and higher sensitivity receivers to increase the return signal from the back wall of the pipeline.

The envisaged transducers will require lower drive voltages for equivalent signal levels in transduction and be more sensitive as receivers. Lower drive voltages also mean smaller and lower power electrical components can be used. Improved miniaturization of transducers will be enabled for high density in-line inspection (ILI) tools. Likewise increased miniaturization of electronics will allow both smaller tools for the same number of transducers and higher density tools with the same tool size.

While illustrative embodiments have been illustrated and described, it will be appreciated that various changes can be made therein without departing from the spirit and scope of the invention.

The embodiments of the invention in which an exclusive property or privilege is claimed are defined as follows:

1. A method of growing a lead zirconate titanate (PZT) single crystal having room temperature PZT lattice parameters comprising
    a=4.03±0.02 Å, c=4.15±0.02 Å, and b=a using liquid phase epitaxy, comprising:
        providing a substrate in a solution, wherein the substrate has a perovskite crystal structure and one or more periodic repeat distances in the plane of growth that are integer multiples of the PZT periodic repeat distances of the same crystal orientation to within 2%, and wherein the solution comprises a solvent and a solute, and wherein the solute comprises PZT or PZT precursors PbO, $TiO_2$, $ZrO_2$, $PbZrO_3$ (PZ) and $PbTiO_3$ (PT); and
        growing the PZT single crystal from the solution onto the substrate using liquid phase epitaxy, wherein the temperature of the solution is held to within 25° C. of a constant growth temperature, wherein the liquid phase epitaxy is performed at a temperature of greater than 700° C.

2. The method of claim 1, wherein the solvent includes a compound selected from the group consisting of $PbF_2$, LiF, NaF, KF, $Na_3AlF_6$, PbO, $Pb_3(PO_4)_2$, $PbCl_2$, $B_2O_3$, $WO_3$, $MoO_3$, $V_2O_5$, $P_2O_5$, $PbWO_4$, $PbMoO_4$, $Li_2B_4O_7$, $Na_2B_4O_7$, $K_2B_4O_7$, and $Pb_2V_2O_7$.

3. The method of claim 1, wherein the substrate has at least one room temperature substrate lattice parameter in the range 4.05±0.04 Å or a multiple of 4.05±0.04 Å by 2 or √2.

4. The method of claim 1, wherein the solubilities of PT and PZ in the melt are equal.

5. The method of claim 1, wherein the solubilities of titanium oxide and zirconium oxide in the melt are equal.

6. The method of claim 1, wherein the PZT is $Pb(Zr_{0.52}Ti_{0.48})O_3$.

7. The method of claim 1, wherein the substrate is selected from the group consisting of $NdScO_3$, $PrScO_3$, $Sr(Na_{1/4}Ta_{3/4})O_3$, $Sr(Na_{1/4}Nb_{3/4})O_3$, $Ba(Fe_yNb_{1-y})O_3$, $Ba(Fe_yTa_{1-y})O_3$, $Ba(Mn_yNb_{1-y})O_3$, $Ba(Mn_yTa_{1-y})O_3$, $Ba(Ni_yNb_{1-y})O_3$, $Ba(Ni_yTa_{1-y})O_3$.

8. The method of claim 1, wherein the substrate comprises a composition selected from the group consisting of a relaxor ferroelectric composition and a normal ferroelectric composition.

9. The method of claim 8, wherein the substrate is grown by the Bridgman method.

10. The method of claim 8, wherein the normal ferroelectric composition comprises lead titanate with a composition of $PbTiO_3$ and the relaxor ferroelectric composition is selected from the group consisting of
    lead magnesium niobate with a composition of $PbMg_{1/3}Nb_{2/3}O_3$,
    lead indium niobate with a composition of $PbIn_{1/2}Nb_{1/2}O_3$,
    lead ytterbium niobate with a composition of $PbYb_{1/2}Nb_{1/2}O_3$,
    a mixture of lead magnesium niobate and lead indium niobate, and
    a mixture of lead magnesium niobate and lead ytterbium niobate.

11. The method of claim 1, further comprising removing the PZT single crystal from the substrate.

12. The method of claim 11, wherein removing the PZT single crystal from the substrate comprises lapping and polishing.

13. A piezoelectric device comprising a PZT single crystal formed according to claim 1.

14. The piezoelectric device of claim 13, wherein the piezoelectric device is selected from the group consisting of a transducer, a receiver, a sensor, and an actuator.

15. A system for characterizing pipelines through in-line inspection comprising a piezoelectric device of claim 14, wherein the piezoelectric device is a transducer and/or a receiver.

16. The system according to claim 15, wherein the pipeline is configured to transport a substance selected from the group consisting of a liquid and a gas.

17. The method of claim 1, wherein the PZT comprises less than 10 molar percent ionic dopants.

* * * * *